(12) United States Patent
Hong et al.

(10) Patent No.: US 12,477,869 B2
(45) Date of Patent: Nov. 18, 2025

(54) DISPLAY DEVICE

(71) Applicant: Samsung Display Co., LTD., Yongin-si (KR)

(72) Inventors: Kwang Taek Hong, Seoul (KR); Ki Nyeng Kang, Sejong-si (KR); Jong Hwan Cha, Suwon-si (KR); Hee Keun Lee, Suwon-si (KR); Min Cheol Chae, Anyang-si (KR); Su Min Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 909 days.

(21) Appl. No.: 17/535,028

(22) Filed: Nov. 24, 2021

(65) Prior Publication Data

US 2022/0320378 A1 Oct. 6, 2022

(30) Foreign Application Priority Data

Apr. 1, 2021 (KR) ........................ 10-2021-0042527

(51) Int. Cl.
*H10H 20/831* (2025.01)
*H10H 29/14* (2025.01)

(52) U.S. Cl.
CPC ...... *H10H 20/8316* (2025.01); *H10H 29/142* (2025.01)

(58) Field of Classification Search
CPC ............ H10H 20/8316; H10H 29/142; H10H 29/011; H10H 29/14; H10H 29/30; H10H 29/32; H10H 29/34; H10H 29/345; H10H 29/352; H10H 29/362; H10H 29/37; H10H 29/39; H10H 29/41; H10H 29/45; H10H 29/49; H10H 29/962; H10H 29/942; H10H 29/922; H10H 29/8517; H10H 29/8552
See application file for complete search history.

(56) References Cited

U.S. PATENT DOCUMENTS

| 7,342,177 | B2 | 3/2008 | Aoki |
| 2022/0052032 | A1 | 2/2022 | Li et al. |
| 2022/0052033 | A1* | 2/2022 | Lee ..................... H10D 86/441 |
| 2022/0115470 | A1 | 4/2022 | Kim et al. |

FOREIGN PATENT DOCUMENTS

| KR | 2004-0071596 A | 8/2004 |
| KR | 2020-0034896 A | 4/2020 |
| KR | 2020-0070493 A | 6/2020 |
| WO | WO 2021/215585 A1 | 10/2021 |

* cited by examiner

*Primary Examiner* — Latanya N Crawford Eason
(74) *Attorney, Agent, or Firm* — Womble Bond Dickinson (US) LLP

(57) ABSTRACT

A display device includes an emission area and a subarea located at a side of the emission area in a first direction, a first electrode extending in the first direction across the emission area and the subarea, a second electrode spaced from the first electrode in a second direction, the second electrode extending in the first direction, a first insulating layer on the first and second electrodes, the first insulating layer including an opening in the subarea, a plurality of light-emitting elements located on the first and second electrodes in the emission area, and a second insulating layer on the first insulating layer in the subarea, wherein the first electrode includes a first electrode extension located in the subarea at a first contact hole, the opening overlaps with the first contact hole and is located above the first electrode extension, and the second insulating layer overlaps the opening.

20 Claims, 22 Drawing Sheets

DISPLAY DEVICE

CROSS-REFERENCE TO RELATED APPLICATION

This application claims priority to and the benefit of Korean Patent Application No. 10-2021-0042527 filed on Apr. 1, 2021 in the Korean Intellectual Property Office, the entire disclosure of which is incorporated by reference herein.

BACKGROUND

1. Field

The present disclosure relates to a display device.

2. Description of the Related Art

Display devices are becoming more important with developments in multimedia technology. Accordingly, various display devices such as an organic light-emitting diode (OLED) display device, a liquid crystal display (LCD) device, and the like have been used.

There are self-luminous display devices including light-emitting elements. Examples of the self-luminous display devices include an organic light-emitting display device using an organic material as a light-emitting material or an inorganic light emitting display device using an inorganic material as a light-emitting material.

SUMMARY

One or more embodiments of the present disclosure provide a display device where, during the separation of electrodes, generation of residues may be reduced or prevented.

However, one or more embodiments of the present disclosure are not restricted to those set forth herein. The above and other embodiments of the present disclosure will become more apparent to one of ordinary skill in the art to which the present disclosure pertains by referencing the detailed description of the present disclosure given below.

According to the aforementioned and other embodiments of the present disclosure, as an insulating layer is provided to cover some of electrodes that are not to be separated, damage to the electrodes that are not to be separated can be reduced or minimized during an electrode separation process, and the size of an area in which to perform the electrode separation process can be reduced or minimized depending on the layout of the insulating layer.

Other features and embodiments may be apparent from the following detailed description, the drawings, and the claims.

According to one or more embodiments of the present disclosure, a display device includes an emission area and a subarea located at a side of the emission area in a first direction, a first electrode extending in the first direction across the emission area and the subarea, a second electrode spaced from the first electrode in a second direction, the second electrode extending in the first direction, a first insulating layer on the first and second electrodes, the first insulating layer including an opening in the subarea, a plurality of light-emitting elements located in the emission area, and a second insulating layer on the first insulating layer in the subarea, wherein the first electrode includes a first electrode extension located in the subarea at a first contact hole, where the opening overlaps with the first contact hole and is located above the first electrode extension, and the second insulating layer overlaps the opening.

The display device may include a separation part located in the subarea, the separation part having none of the first and second insulating layers disposed therein, wherein the first electrode adjoins the separation part of the subarea and the separation part of another subarea.

An area of the opening of the first insulating layer may be smaller than an area of the separation part.

The display device may further include a third electrode located between the first and second electrodes, the third electrode extending in the first direction from the separation part, and a fourth electrode spaced from the third electrode in the second direction with the first electrode interposed therebetween, wherein the light-emitting elements may include first light-emitting elements located on the first and fourth electrodes, and second light-emitting elements located on the second and third electrodes.

One end portion, in the first direction, of the third electrode may adjoin the separation part, and an other end portion, in the first direction, of the third electrode may be located in the emission area.

The fourth electrode may adjoin a side, in the second direction, of the separation part of the subarea and extend in the first direction to adjoin a side, in the first direction, of the separation part of another subarea.

The display device may further include a first connecting electrode on the first electrode, in the emission area, the first connecting electrode being in contact with the light-emitting elements, and a second connecting electrode on the second electrode, in the emission area, the second connecting electrode being in contact with the light-emitting elements, wherein the first insulating layer may further include a plurality of contacts overlapping the first or second electrodes in the emission area, where the first connecting electrode may be in contact with the first electrode through a first contact, and the second connecting electrode may be in contact with the second electrode through a second contact.

The display device may further include a third insulating layer on the second insulating layer, wherein the third insulating layer may overlap the separation part, in the subarea.

The display device may further include a bank layer on the first insulating layer, where the bank layer is around the emission area and the subarea, wherein the second electrode may overlap with a part of the bank layer that extends in the first direction.

The second electrode may include a second electrode extension at a second contact hole to overlap with the part of the bank layer that extends in the first direction, on a lower side of the emission area.

According to one or more embodiments of the present disclosure, a display device includes a first substrate including an emission area and a subarea located at a side of the emission area in a first direction, a via layer disposed on the first substrate, a first electrode extending in the first direction on the via layer across the emission area and the subarea, a plurality of second electrodes spaced from each other in a second direction with the first electrode interposed therebetween, a dummy pattern located in the subarea to be spaced from the first electrode, a first insulating layer on the first and second electrodes and including an opening above the dummy pattern in the subarea, a plurality of light-emitting elements located on the first and second electrodes, in the emission area, and a second insulating layer on the light-emitting elements, in the emission area, and on the first insulating layer in the subarea, wherein the second insulating layer is disposed to overlap the opening is and is in direct contact with the dummy pattern.

The display device may include a separation part located in the subarea, the separation part having none of the first and second insulating layers disposed therein, wherein the first electrode may be spaced from the dummy pattern with the separation part interposed therebetween.

The display device may further include a bank layer on the first insulating layer, the bank layer is around the emission area and the subarea, wherein the first electrode may overlap with a part of the bank layer that extends in the second direction and is at a first contact hole that penetrates the via layer, and the second electrode may overlap with a part of the bank layer that extends in the first direction and is at a second contact hole that penetrates the via layer.

The dummy pattern may be in the subarea at a third contact hole that penetrates the via layer, and the opening may overlap with the third contact hole.

The display device may further include a conductive layer located between the first substrate and the via layer, the conductive layer including a first voltage line, a second voltage line, and a conductive pattern, wherein the first electrode may be in contact with the conductive pattern through the first contact hole, the second electrode may be in contact with the second voltage line through the second contact hole, and the dummy pattern may be in contact with the first voltage line through the third contact hole.

The second electrode may overlap the bank layer, on a side, in the second direction, of the subarea and may be spaced from the separation part.

The second electrode includes electrode stems extending in the first direction and located at respective sides of the subarea that are spaced from each other in the second direction, and a plurality of electrode branches that branch from the electrode stems to be located in different emission areas, the first electrode may be spaced from, and oppose, electrode branches of different second electrodes, in the emission area.

The electrode branches may include a first electrode branch at a side, in the second direction, of the first electrode, and a second electrode branch at an other side, in the second direction, of the first electrode, and the light-emitting elements may include first light-emitting elements on the first electrode and the second electrode branch, and second light-emitting elements on the first electrode and the first electrode branch.

The display device may further include a first connecting electrode on the first electrode and in contact with the first light-emitting elements, a second connecting electrode on the second electrode and in contact with the second light-emitting elements, and a third connecting electrode including a first extension, a second extension, and a first connector, the first extension being on the second electrode branch and being in contact with the first light-emitting elements, the second extension being on the first electrode branch and being in contact with the second light-emitting elements, and the first connector connecting the first and second extensions.

The first insulating layer may further include a plurality of contacts overlapping the first electrode or the second electrodes, in the emission area, the first connecting electrode may be in contact with the first electrode through a first contact, and the second connecting electrode may be in contact with one of the second electrodes through a second contact.

BRIEF DESCRIPTION OF THE DRAWINGS

The above and other embodiments and features of the disclosure will become more apparent by describing in detail embodiments thereof with reference to the attached drawings, in which.

DETAILED DESCRIPTION

Figure 1:
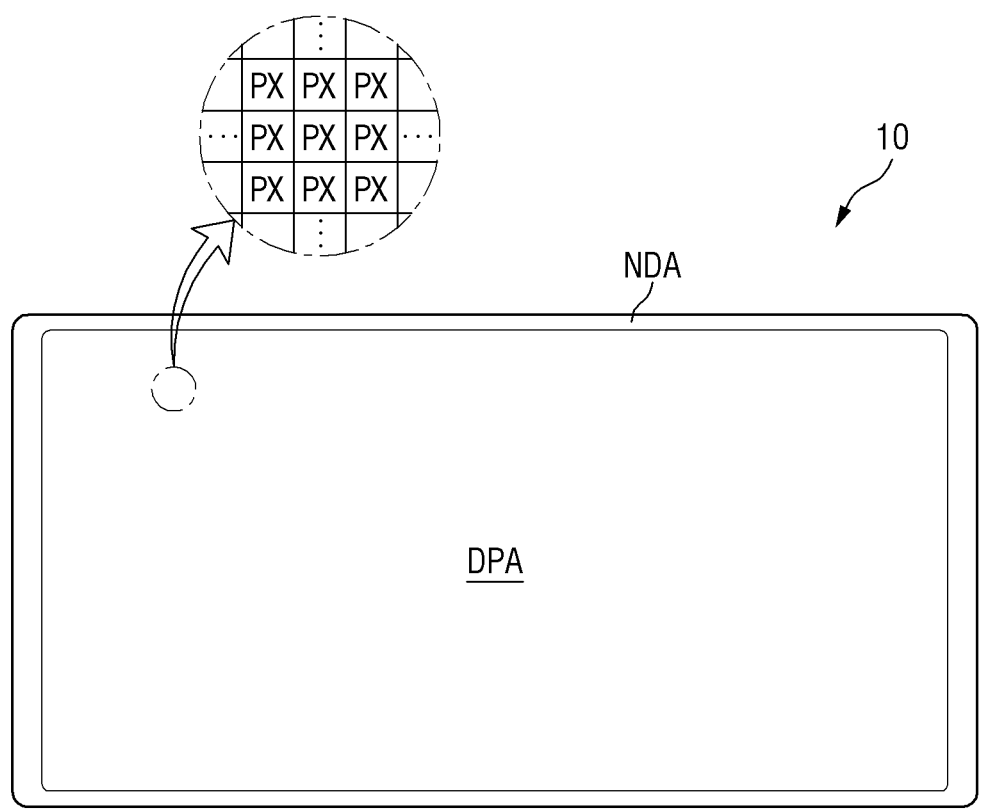
FIG. 1 is a plan view of a display device according to one or more embodiments of the present disclosure.
Figure 1:
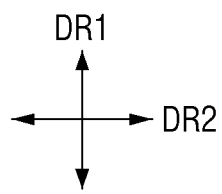

The present disclosure will now be described more fully hereinafter with reference to the accompanying drawings, in which one or more embodiments of the present disclosure are shown. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings, spirit, and scope of the present disclosure. Similarly, the second element could also be termed the first element.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the present disclosure. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present disclosure refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Hereinafter, one or more embodiments will be described with reference to the accompanying drawings.

FIG. 1 is a plan view of a display device according to one or more embodiments of the present disclosure.

Referring to FIG. 1, a display device 10 displays a moving image or a still image. The display device 10 may refer to nearly all types of electronic devices that provide a display screen. Examples of the display device 10 may include a television (TV), a notebook computer, a monitor, a billboard, an Internet-of-Things (IoT) device, a mobile phone, a smartphone, a tablet personal computer (PC), an electronic watch, a smartwatch, a watchphone, a head-mounted display (HMD), a mobile communication terminal, an electronic notepad, an electronic book (e-book), a portable multimedia player (PMP), a navigation device, a gaming console, a digital camera, a camcorder, and the like.

The display device 10 includes a display panel that provides a display screen. Examples of the display panel of the display device 10 include an inorganic light-emitting diode (ILED) display panel, an organic light-emitting diode (OLED) display panel, a quantum-dot light-emitting diode (QLED) display panel, a plasma display panel (PDP), a field-emission display (FED) panel, and the like. The display panel of the display device 10 will hereinafter be described as being, for example, an ILED display panel, but the present disclosure is not limited thereto. That is, various other display panels are also applicable to the display panel of the display device 10.

The shape of the display device 10 may vary. In one or more embodiments, the display device 10 may have a rectangular shape that extends longer in a horizontal direction than in a vertical direction, a rectangular shape that extends longer in the vertical direction than in the horizontal direction, a square shape, a tetragonal shape with rounded corners, a non-tetragonal polygonal shape, or a circular shape. The shape of a display area DPA of the display device 10 may be similar to the shape of the display device 10. FIG. 1 illustrates that the display device 10 and the display area DPA both have a rectangular shape that extends in a second direction DR2.

The display device 10 may include the display area DPA and a non-display area NDA. The display area DPA may be an area in which an image is displayed, and the non-display area NDA may be an area in which an image is not displayed. The display area DPA may also be referred to as an active area, and the non-display area NDA may also be referred to as an inactive area. The display area DPA may occupy the middle part of the display device 10.

The display area DPA may include a plurality of pixels PX. The pixels PX may be arranged in row and column directions. For example, the pixels PX may be arranged along rows and columns of a matrix. The pixels PX may have a rectangular or square shape in a plan view, but the present disclosure is not limited thereto. Alternatively, the pixels PX may have a rhombus shape having sides that are inclined with respect to a particular direction. The pixels PX may be arranged in a stripe or a PENTILE™ arrangement structure, but the present disclosure is not limited thereto. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. Each of the pixels PX may include one or more light-emitting elements emitting light of a particular wavelength range and may thus display a particular color.

The non-display area NDA may be disposed around the display area DPA. For example, the non-display area NDA may be disposed along an edge or periphery of the display area DPA. The non-display area NDA may be around (or surround) the entire display area DPA or part of the display area DPA. The display area DPA may have a rectangular shape, and the non-display area NDA may be disposed adjacent to four sides of the display area DPA. The non-display area NDA may form the bezel of the display device 10. Lines or circuit drivers included in the display device 10 may be disposed in the non-display area NDA, or external devices may be mounted in the non-display area NDA.

Figure 2:
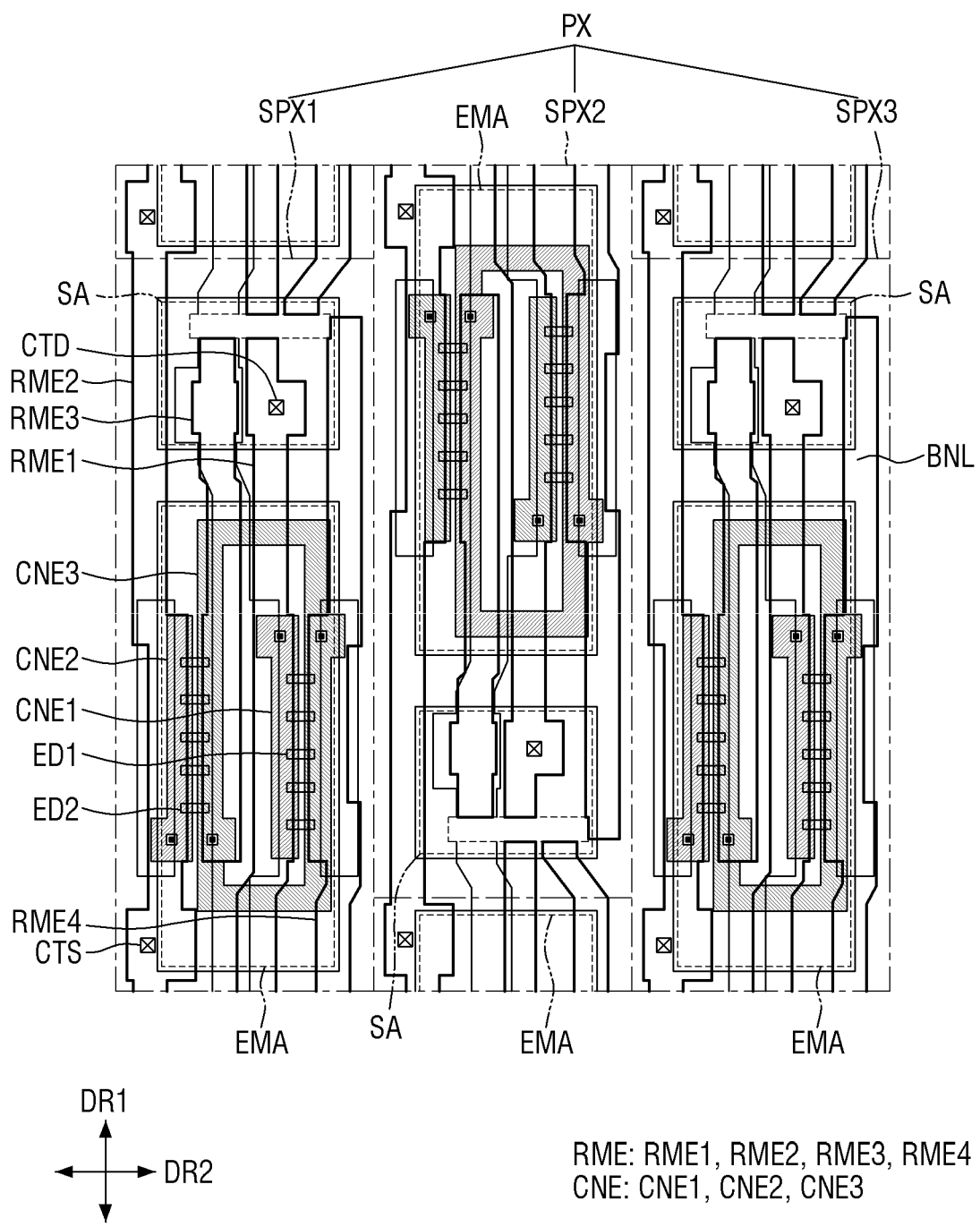
FIG. 2 is a plan view of a pixel of the display device of FIG. 1.

FIG. 2 is a plan view of a pixel of the display device of FIG. 1.

Referring to FIG. 2, a pixel PX of the display device 10 may include a plurality of subpixels SPXn (where n is an integer of 1 to 3). In one or more embodiments, the pixel PX may include first, second, and third subpixels SPX1, SPX2, and SPX3. The first subpixel SPX1 may emit first-color light, the second subpixel SPX2 may emit second-color light, and the third subpixel SPX3 may emit third-color light. In one or more embodiments, the first-color light, the second-color light, and the third-color light may be blue light, green light, and red light, respectively, but the present disclosure is not limited thereto. Alternatively, the subpixels SPXn may all emit light of the same color. In one or more embodiments, the subpixels SPXn may all emit blue light. FIG. 2 illustrates that the pixel PX may include three subpixels SPXn, but the present disclosure is not limited thereto. Alternatively, the pixel PX may include more than three subpixels SPXn.

Each of the subpixels SPXn may include an emission area EMA and a non-emission area. The emission area EMA may be an area that outputs light of a particular wavelength range due to light-emitting elements ED being disposed therein. The non-emission area may be an area that has no light-emitting elements ED disposed therein, is not reached by light emitted by light-emitting elements ED, and thus does not output light.

The emission area EMA may include a region where the light-emitting elements ED are disposed and a region around the light-emitting elements ED where light emitted by the light-emitting elements ED is output. However, the present disclosure is not limited to this. The emission area EMA may also include regions that output light emitted by the light-emitting elements ED and then reflected or refracted by other members. A plurality of light-emitting elements ED may be disposed in each of the subpixels SPXn to form an emission area EMA including a region in which the plurality of light-emitting elements ED are disposed and the surroundings of the region in which the plurality of light-emitting elements ED are disposed.

FIG. 2 illustrates that the emission areas EMA of the first, second, and third subpixels SPX1, SPX2, and SPX3 have substantially the same size. In some embodiments, the emission areas EMA of the subpixels SPXn may have different sizes depending on the color or the wavelength of light emitted by the light-emitting elements ED.

Each of the subpixels SPXn may further include a subarea SA, which is disposed in the non-emission area of the corresponding subpixel SPXn. The subarea SA may be disposed on a first side, in a first direction DR1, of the emission area EMA of the corresponding subpixel SPXn, between the emission area EMA of the corresponding subpixel SPXn and the emission area EMA of a neighboring subpixel SPXn adjacent to the corresponding subpixel SPXn in the first direction DR1. The emission areas EMA or the subareas SA of the subpixels SPXn may be arranged adjacent to one another along the first direction DR1, but some of the subpixels SPXn may have their emission areas EMA and subareas SA arranged along a different direction from the other subpixels SPXn. That is, a plurality of emission areas EMA and a plurality of subareas SA may be alternately arranged not only along the first direction DR1, but also in the second direction DR2.

In one or more embodiments, in each of the first and third subpixels SPX1 and SPX3, the subarea SA may be disposed on a first side, in the first direction DR1, of the emission area EMA, i.e., on the upper side of the emission area EMA, and in the second subpixel SPX2, the subarea SA may be disposed on a second side, in the first direction DR1, of the emission area EMA, i.e., on the lower side of the emission area EMA. The emission areas EMA of the first, second, and third subpixels SPX1, SPX2, and SPX3 may be arranged not in line, but in a staggered fashion, with one another along the second direction DR2. The emission areas EMA of the first and third subpixels SPX1 and SPX3 may be arranged in a line with each other along the second direction DR2, and the subarea SA of the second subpixel SPX2 may be disposed between the emission areas EMA of the first and third subpixels SPX1 and SPX3. Similarly, the subareas of the first, second, and third subpixels SPX1, SPX2, and SPX3 may be arranged not adjacent to one another in the first or second direction DR1 or DR2, but may be spaced from one another in a diagonal direction. Accordingly, the emission areas EMA of the first, second, and third subpixels SPX1, SPX2, and SPX3 may be arranged as islands and may be spaced from one another in a diagonal direction between the first and second directions DR1 and DR2. However, the present disclosure is not limited to this. Alternatively, a plurality of emission areas EMA or a plurality of subareas SA may be repeatedly arranged along the second direction DR2, and the plurality of emission areas EMA and the plurality of subareas SA may be alternately arranged along the second direction DR2.

A bank layer BNL may be disposed between the subareas SA of the subpixels SPXn, between the emission areas EMA of the subpixels SPXn, and between the subareas SA and the emission areas EMA of the subpixels SPXn, the distances between the subareas SA of the subpixels SPXn, between the emission areas EMA of the subpixels SPXn, and between the subareas SA and the emission areas EMA of the subpixels SPXn may vary depending on the width of the bank layer BNL. As no light-emitting elements ED are disposed in the subareas SA of the subpixels SPXn, no light may be output from the subareas SA of the subpixels SPXn, but electrodes RME may be disposed in part in the subareas SA of the subpixels SPXn. Two groups of electrodes RME from two different subpixels SPXn may be separated from each other in a separation part ROP of a subarea SA of one of the two different subpixels SPXn.

The bank layer BNL may include parts that extend in the first direction DR1 and parts that extend in the second direction DR2 and may be arranged in a lattice pattern in a plan view, over the entire display area DPA. The bank layer BNL may be disposed along the boundaries of each of the subpixels SPXn to separate the subpixels SPXn from one another. Also, the bank layer BNL may be disposed to be around (or surround) each of the emission areas EMA of the subpixels SPXn to separate the emission areas EMA of the subpixels SPXn from one another. As each pair of adjacent subpixels SPXn in the second direction DR2 have different patterns of arrangement of their emission areas EMA and subareas SA, the bank layer BNL may be arranged in a lattice pattern such that areas around (or surrounded) by the bank layer BNL in the first and second directions DR1 and DR2 may be arranged in diagonal directions with respect to one another. The bank layer BNL include parts that extend in the first direction DR1 and parts that extend in the second direction DR2, and the parts of the bank layer BNL that extend in the second direction DR2 may be shorter than the parts of the bank layer BNL that extend in the first direction DR1. Emission areas EMA may be positioned between the parts of the bank layer BNL that extend in the second direction DR2.

Figure 3:
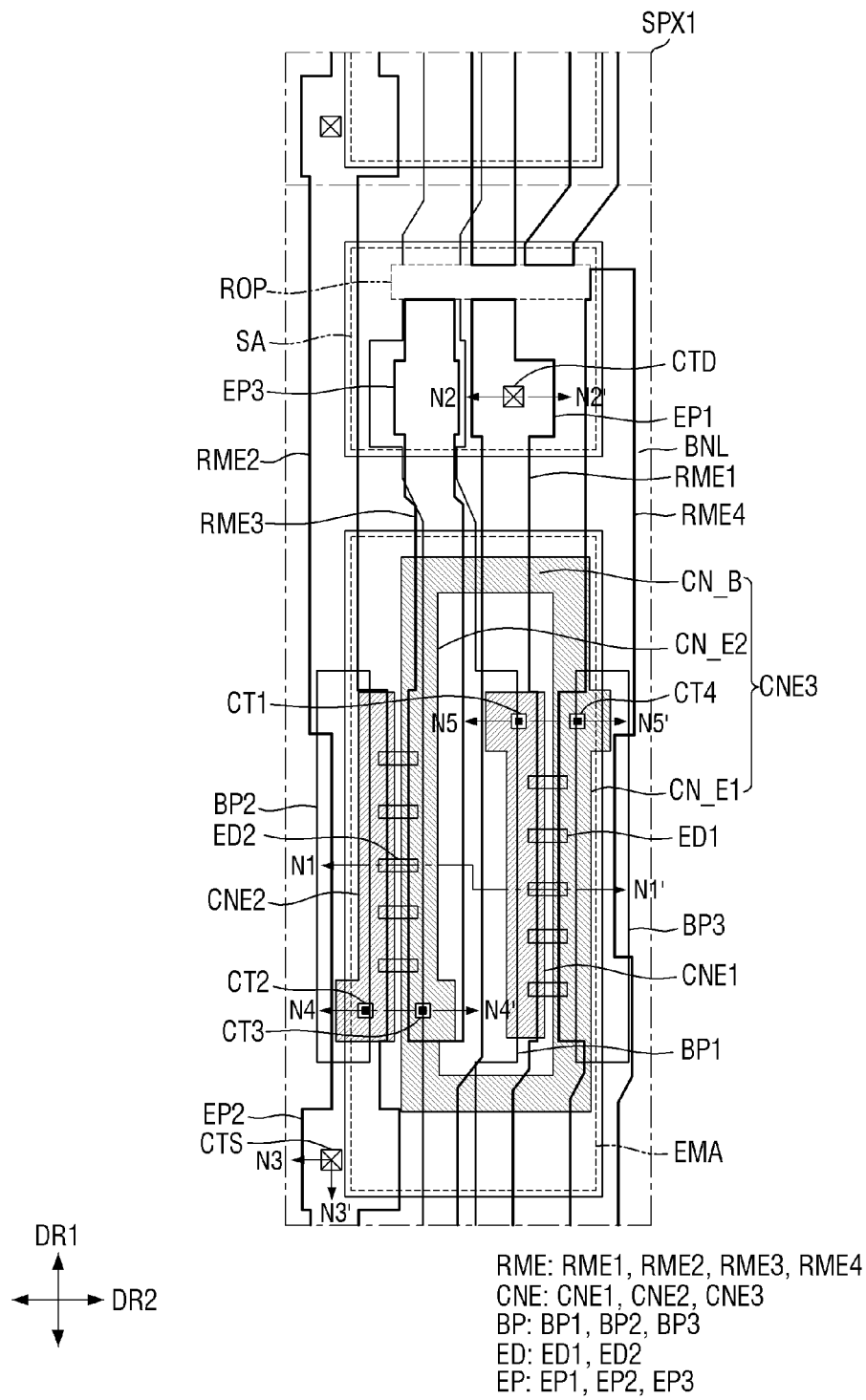
FIG. 3 is a plan view of a first subpixel of FIG. 2.
Figure 4:
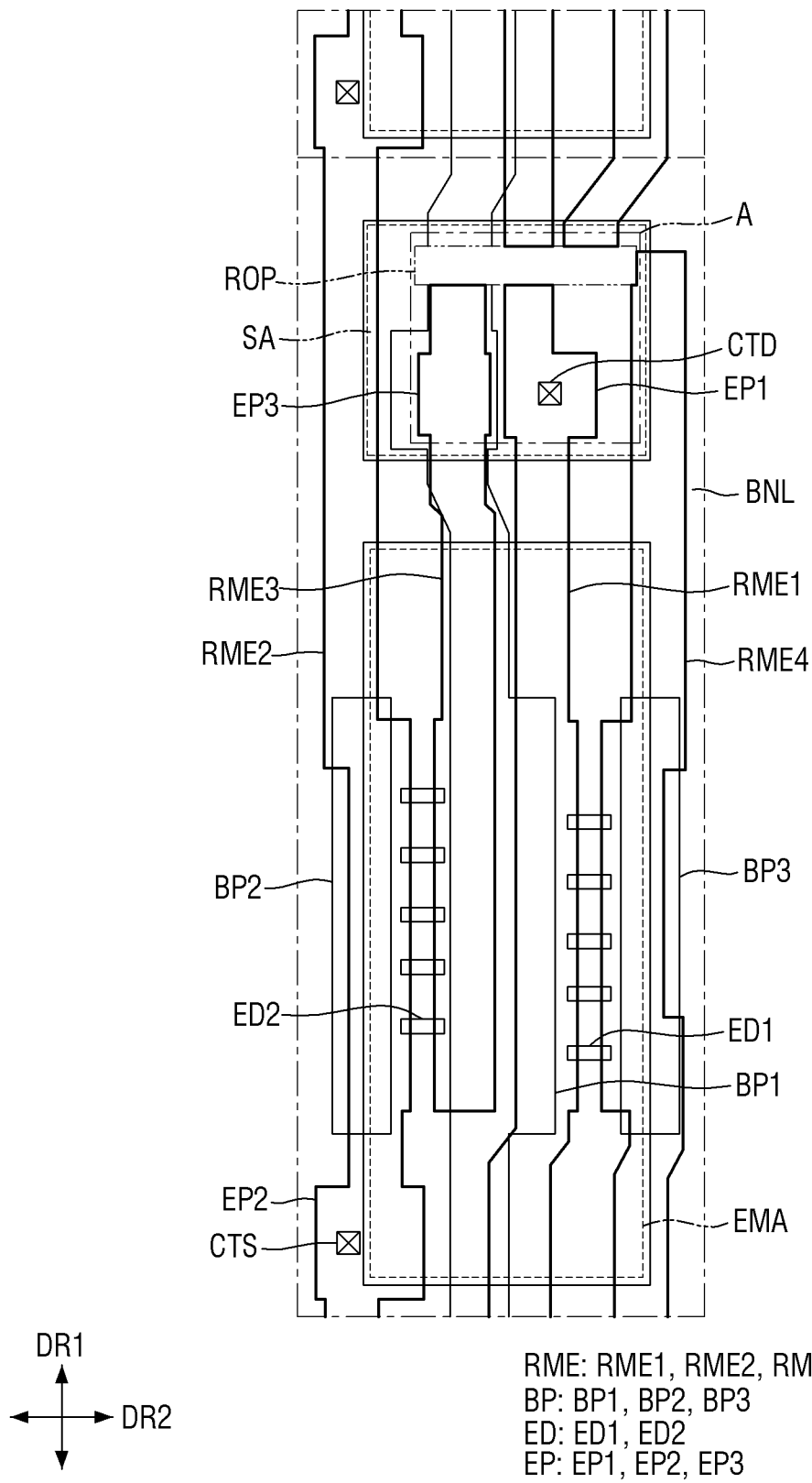
FIG. 4 is a plan view illustrating an arrangement of electrodes, bank patterns, and light-emitting elements in the first subpixel of FIG. 3.
Figure 5:
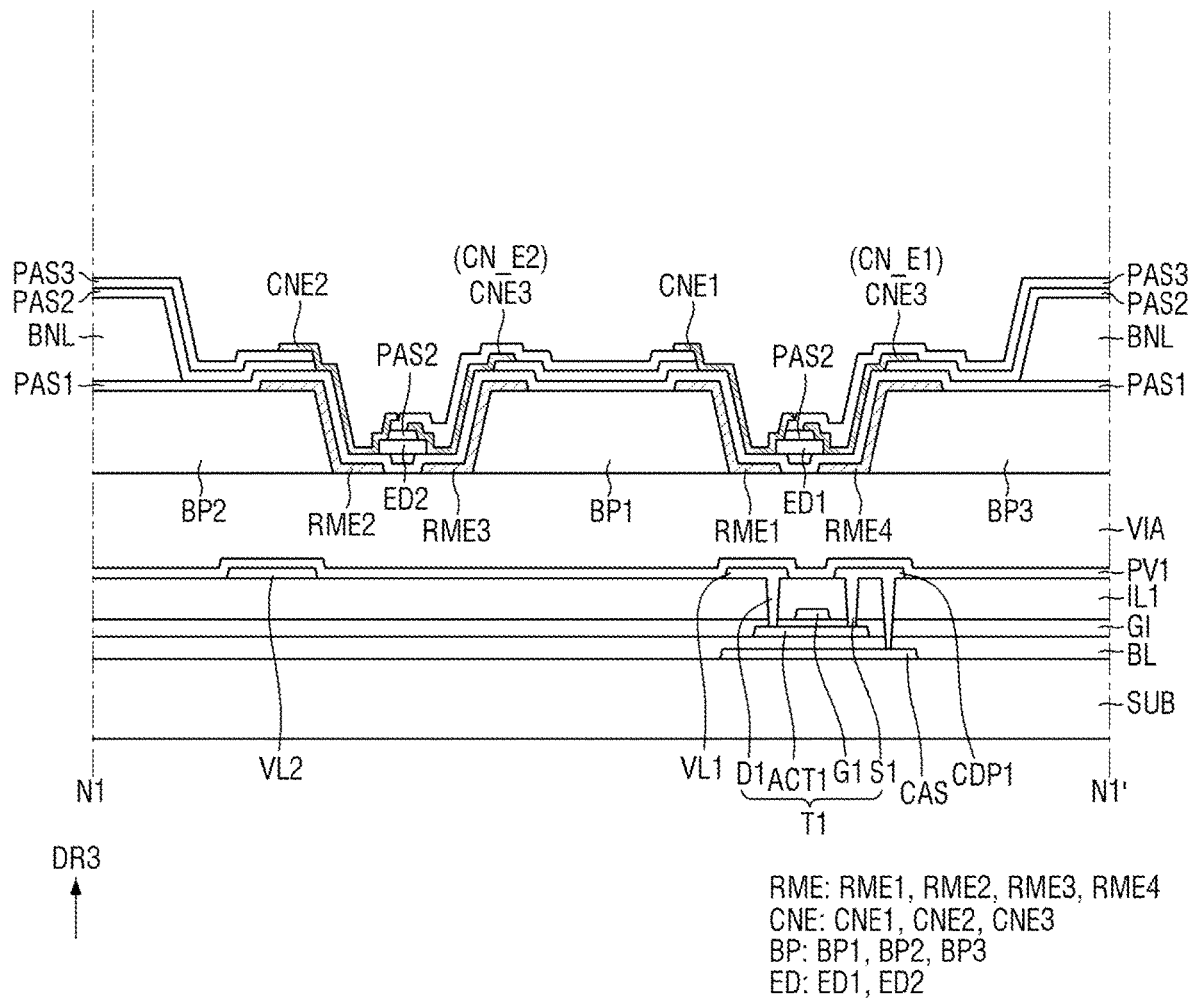
FIG. 5 is a cross-sectional view taken along the line N1-N1' of FIG. 3.
Figure 6:
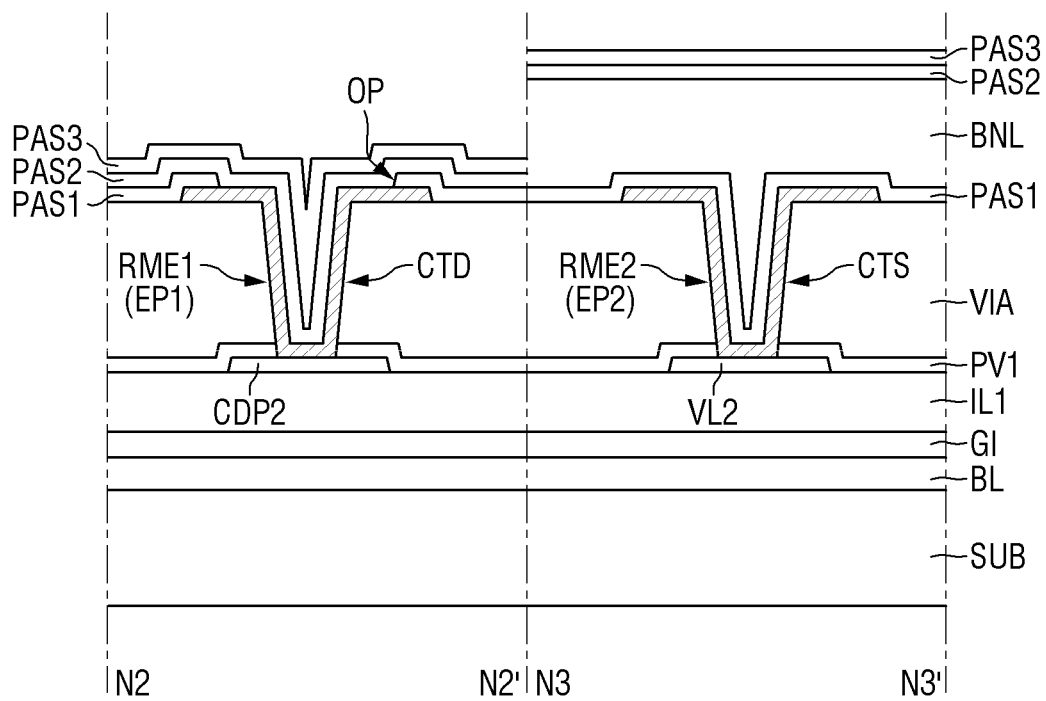
FIG. 6 is a cross-sectional view taken along the lines N2-N2' and N3-N3' of FIG. 3.
Figure 7:
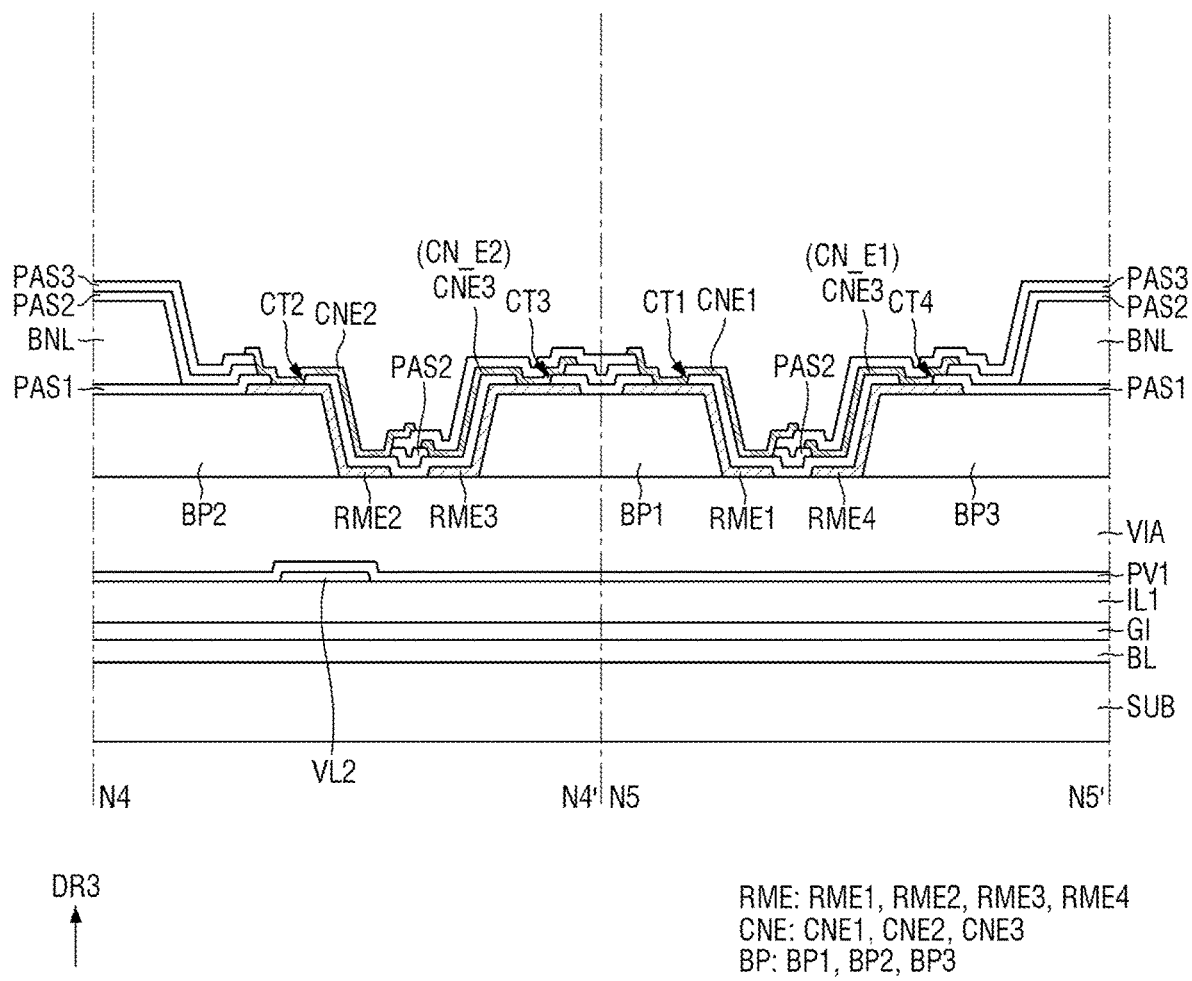
FIG. 7 is a cross-sectional view taken along the lines N4-N4' and N5-N5' of FIG. 3.

FIG. 3 is a plan view of the first subpixel of FIG. 2. FIG. 4 is a plan view illustrating the arrangement of electrodes, bank patterns, and light-emitting elements in the first subpixel of FIG. 3. FIG. 5 is a cross-sectional view taken along the line N1-N1' of FIG. 3. FIG. 6 is a cross-sectional view taken along the lines N2-N2' and N3-N3' of FIG. 3. FIG. 7 is a cross-sectional view taken along the lines N4-N4' and N5-N5' of FIG. 3. FIG. 4 illustrates the arrangement of bank patterns BP, electrodes RME, and light-emitting elements ED relative to one another in the first subpixel SPX1, and FIG. 5 illustrates a cross-sectional view taken from one end portion to the other end portion of a first light-emitting element ED1 in the first subpixel SPX1 and from one end portion to the other end portion of a second light-emitting element ED2 in the first subpixel SPX1. FIG. 6 illustrates a cross-sectional view taken along the first and second contact holes CTD and CTS, and FIG. 7 illustrates a cross-sectional view taken along a plurality of first through fourth contacts CT1 through CT4 of FIG. 3.

Referring to FIGS. 3-7 and further to FIG. 2, the display device 10 may include, in the first subpixel SPX1, the first substrate SUB and may further include a semiconductor layer, a plurality of conductive layers, and a plurality of insulating layers, which are disposed on the first substrate SUB. The active layer, the conductive layers, and the insulating layers may form a circuit layer and a display element layer of the display device 10.

For example, the first substrate SUB may be an insulating substrate. The first substrate SUB may be formed of an insulating material such as glass, quartz, or a polymer resin. The first substrate SUB may be a rigid substrate or may be a flexible substrate that is bendable, foldable, or rollable. The first substrate SUB may include an emission area EMA and a subarea SA, which are surrounded by the bank layer BNL.

A first conductive layer may be disposed on the first substrate SUB. The first conductive layer includes a lower metal layer CAS, and the lower metal layer CAS is disposed to overlap with an active layer ACT1 of a first transistor T1 in a thickness direction of the first substrate SUB, for example, a third direction DR3. The lower metal layer CAS may include a material capable of blocking the transmission of light and may prevent light from being incident upon the active layer ACT1 of the first transistor T1. In one or more embodiments, the lower metal layer CAS may not be provided.

A buffer layer BL may be disposed on the lower metal layer CAS and the first substrate SUB. The buffer layer CAS may be formed on the first substrate SUB to protect the transistors of the first subpixel SPX1 from moisture that may penetrate through the first substrate SUB, which is vulnerable to moisture, and may perform a surface planarization function.

The semiconductor layer is disposed on the buffer layer BL. The active layer may include the active layer ACT1 of the first transistor T1. The active layer ACT1 may be disposed to partially overlap in the third direction DR3 with a gate electrode G1 in a second conductive layer that will be described later.

The semiconductor layer may include polycrystalline silicon, monocrystalline silicon, or an oxide semiconductor. Alternatively, the semiconductor layer may include polycrystalline silicon. The oxide semiconductor may be an oxide semiconductor containing indium (In). In one or more embodiments, the oxide semiconductor may be at least one of indium tin oxide (ITO), indium zinc oxide (IZO), indium gallium oxide (IGO), indium zin tin oxide (IZTO), indium gallium tin oxide (IGTO), or indium gallium zinc tin oxide (IGZTO).

FIGS. 3-7 illustrate that the first subpixel SPX1 includes only one first transistor T1, but the present disclosure is not limited thereto. That is, the first subpixel SPX1 may include more than one transistor.

A first gate insulating layer GI is disposed on the semiconductor layer and the buffer layer BL. The first gate insulating layer GI may function as a gate insulating film for the first transistor T1.

A second conductive layer is disposed on the first gate insulating layer GI. The second conductive layer may include a gate electrode G1 of the first transistor T1. The gate electrode G1 may be disposed to overlap with the channel region of the active layer ACT1 in the thickness direction of the first substrate SUB, i.e., in the third direction DR3.

A first interlayer insulating layer IL1 is disposed on the second conductive layer and the first gate insulating layer GI. The first interlayer insulating layer IL1 may function as an insulating film between the second conductive layer and layers disposed on the second conductive layer and may protect the second conductive layer.

A third conductive layer is disposed on the first interlayer insulating layer IL1. The third conductive layer may include first and second voltage lines VL1 and VL2 and a plurality of conductive patterns (CDP1 and CDP2), which are all disposed in the display area DPA.

A high-potential voltage (or a first power supply voltage) to be delivered to the light-emitting elements ED may be applied to the first voltage line VL1, and a low-potential voltage (or a second power supply voltage) to be delivered to the light-emitting elements ED may be applied to the second voltage line VL2. The first voltage line VL1 may apply the first power supply voltage to the light-emitting elements ED through the first transistor T1 and a first connecting electrode CNE1, and the second voltage line VL2 may apply the second power supply voltage to the light-emitting elements ED through a second connecting electrode CNE2. Part of the first voltage line VL1 may be in contact with the active layer ACT1 of the first transistor T1 through a contact hole that penetrates through the first interlayer insulating layer IL1 and the first gate insulating layer GI. The first voltage line VL1 may function as a first drain electrode D1 of the first transistor T1.

A first conductive pattern CDP1 may be in contact with the active layer ACT1 of the first transistor T1 through a contact hole that penetrates through the first interlayer insulating layer IL1 and the first gate insulating layer GI. Also, the first conductive pattern CDP1 may be in contact with the lower metal layer CAS through another contact hole that penetrates through the first interlayer insulating layer IL1, the first gate insulating layer GI, and the buffer layer BL. The first conductive pattern CDP1 may function as a first source electrode S1 of the first transistor T1.

In one or more embodiments, a second conductive pattern CDP2 may be electrically connected to the first connecting electrode CNE1 (see, for example, FIG. 7, where the first connecting electrode CNE1 is connected to the first electrode RME1, and see, for example, FIG. 6, where the first electrode RME1 is connected to the second conductive pattern CDP2). The second conductive pattern CDP2 may be electrically connected to the first transistor T1 via the first conductive pattern CDP1. The first and second conductive patterns CDP1 and CDP2 are illustrated as being separate from each other, but alternatively, the second conductive pattern CDP2 may be integrally formed with the first conductive pattern CDP1 and may thus form a single pattern together with the first conductive pattern CDP1.

The first and second conductive patterns CDP1 and CDP2 are illustrated as being formed at the same layer, but the present disclosure is not limited thereto. Alternatively, the second conductive pattern CDP2 may be formed in a different conductive layer from the first conductive pattern CDP1, for example, in a fourth conductive layer disposed on the third conductive layer with a number of insulating layers interposed therebetween. In this case, the first and second voltage lines VL1 and VL2 may be formed in the fourth conductive layer, rather than in the third conductive layer, and the first voltage line VL1 may be electrically connected to the drain electrode D1 of the first transistor T1 via another conductive pattern.

A first passivation layer PV1 is disposed on the third conductive layer and the first interlayer insulating layer IL1. The first passivation layer PV1 may function as an insulating film between the third conductive layer and other layers and may protect the third conductive layer.

Each of the buffer layer BL, the first gate insulating layer GI, the first interlayer insulating layer IL1, and the first passivation layer PV1 may consist of a plurality of inorganic layers that are alternately stacked. In one or more embodiments, each of the buffer layer BL, the first gate insulating layer GI, the first interlayer insulating layer IL1, and the first passivation layer PV1 may be formed as a double- or multilayer in which inorganic layers of at least one of silicon oxide ($SiO_x$), silicon nitride ($SiN_x$), and silicon oxynitride ($SiO_xN_y$) are alternately stacked, but the present disclosure is not limited thereto. In one or more embodiments, each of the buffer layer BL, the first gate insulating layer GI, the first interlayer insulating layer IL1, and the first passivation layer PV1 may be formed as a single inorganic layer including silicon oxide ($SiO_x$), silicon nitride ($SiN_x$), or silicon oxynitride ($SiO_xN_y$). Also, in one or more embodiments, the first interlayer insulating layer IL1 may be formed of an organic insulating material such as polyimide (PI).

The second and third conductive layers may be formed as single layers or multilayers including molybdenum (Mo), aluminum (Al), chromium (Cr), gold (Au), titanium (Ti), nickel (Ni), neodymium (Nd), copper (Cu), or an alloy thereof, but the present disclosure is not limited thereto.

A via layer VIA is disposed on the first passivation layer PV1, in the display area DPA. The via layer VIA may include an organic insulating material such as, for example, PI, and may perform a surface planarization function.

As parts of the display element layer, a plurality of bank patterns BP, a plurality of electrodes RME, a plurality of light-emitting elements ED, and a plurality of connecting electrodes CNE are disposed on the via layer VIA. A plurality of first, second, and third insulating layers PAS1, PAS2, and PAS3 may also be disposed on the via layer VIA.

The bank patterns BP may be disposed directly on the via layer VIA. The bank patterns BP may extend in the first direction DR1 and may be spaced from one another in the second direction DR2. In one or more embodiments, the bank patterns BP may include a first bank pattern BP1, which extends in the first direction DR1 across multiple subpixels SPXn arranged along the first direction DR1, including the first subpixel SPX1, and second and third bank patterns BP2 and BP3, which are disposed in the emission area EMA of the first subpixel SPX1 and are spaced from the first bank pattern BP1.

The first bank pattern BP1 may extend in the first direction DR1 and may be disposed beyond the emission area EMA and the subarea SA of the first subpixel SPX1. The first bank pattern BP1 may include a first bank part disposed in the emission area EMA, a second bank part disposed in the subarea SA, and a third bank part connecting the first and second bank parts.

The first bank part of the first bank pattern BP1 may be disposed between the second and third bank patterns BP2 and BP3 to form space in which the light-emitting elements ED are arranged. The first bank part may have a larger width than the third bank part so that the electrodes RME may be disposed on the first bank part. The second bank part may be disposed in the subarea SA and may have a larger width than the first and third bank parts. A third electrode extension EP3 of a third electrode RME3 may be disposed on the second bank part, and the second bank part may form a relatively flat, high surface in the subarea SA. The third bank part may generally extend in the first direction DR1 and may be bent in part. The third bank part is part of the first bank pattern BP1 that connects the first and second bank parts arranged along the first direction DR1. The third bank part may account for the entire first bank pattern BP1 except for the first and second bank parts.

The second bank pattern BP2 may be disposed on one side, in the second direction DR2, of the center of the emission area EMA (e.g., on the left side of the center of the emission area EMA), and the third bank pattern BP3 may be disposed on the other side, in the second direction DR2, of the center of the emission area EMA (e.g., on the right side of the center of the emission area EMA). The second and third bank patterns BP2 and BP3 may extend in the first direction DR1 and may have a smaller length than the emission area EMA in the first direction DR1. The second and third bank patterns BP2 and BP3 may overlap in part with the parts of the bank layer BNL that extend in the first direction DR1. The light-emitting elements ED may be disposed between the first bank part of the first bank pattern BP1 and the second bank pattern BP2 and between the first bank part of the first bank pattern BP1 and the third bank pattern BP3.

The bank patterns BP may protrude at least in part from the top surface of the via layer VIA. Each of protruding parts of the bank patterns BP may have inclined side surfaces, and light emitted from the light-emitting elements ED may be reflected from the electrodes RME on the bank patterns BP to be emitted in an upward direction of the via layer VIA (e.g., an image display direction of the display device 10, i.e., the third direction DR3). However, the present disclosure is not limited to this. Alternatively, the bank patterns BP may have a semicircular or semielliptical shape with curvature. The bank patterns BP may include an organic insulating material such as PI, but the present disclosure is not limited thereto.

The electrodes RME may extend in one direction and may be disposed in each subpixel SPXn, for example, in the first subpixel SPX1. The electrodes RME may extend in the first direction DR1, may be disposed in the emission area EMA, and may be spaced from one another along the second direction DR2. The electrodes RME may be electrically connected to the light-emitting elements ED through the connecting electrodes CNE and may transmit electrical signals applied thereto from the underlying conductive layers to the light-emitting elements ED.

The display device 10 may include first, second, third, and fourth electrodes RME1, RME2, RME3, and RME4. The first electrode RME1 may be disposed in the middle of the emission area EMA, and the second electrode RME2 may be spaced from the first electrode RME1 along the second direction DR2 and may be disposed on the left side of the emission area EMA. The third electrode RME3 may be disposed between the first and second electrodes RME1 and RME2, and the fourth electrode RME4 may be spaced from the first electrode RME1 in the second direction DR2 and may be disposed on the right side of the emission area EMA.

The first electrode RME1 may be disposed in and across the emission area EMA and the subarea SA. A first end portion, in the first direction DR1, of the first electrode RME1 may be disposed at the boundary of the separation part ROP of the subarea SA, and a second end portion, in the first direction DR1, may be disposed in a subarea SA of a lower neighboring subpixel SPXn. The electrodes RME of the first subpixel SPX1 may be spaced from electrodes RME of an upper neighboring subpixel SPXn in the first direction DR1 by the separation part ROP of the subarea SA.

The second electrode RME2 may extend in the first direction DR1 and may be disposed in multiple subpixels SPXn arranged along the first direction DR1 including the first subpixel SPX1. The second electrode RME2, unlike the first electrode REM1, may be disposed in multiple subpixels SPXn arranged along the first direction DR1 and may overlap with the parts of the bank layer BNL that extend in the first direction DR1.

The third electrode RME3 may be disposed in and across the emission area EMA and the subarea SA. A first end portion, in the first direction DR1, of the third electrode RME3 may be disposed at the boundary of the separation part ROP of the subarea SA, and a second end portion, in the first direction DR1, of the third electrode RME3 may be disposed in the emission area EMA. The third electrode RME3 may include the third electrode extension EP3, which is disposed on the second bank part of the first bank pattern BP1, in the subarea SA. In one or more embodiments, patterns that include insulating layers or conductive layers on the electrodes RME may be disposed on the third electrode extension EP3.

The fourth electrode RME4, like the first electrode RME1, may extend in the first direction DR1 and may be spaced from a fourth electrode RME4 of the upper neighboring subpixel SPXn in the first direction DR1, in the subarea SA. The fourth electrode RME4 may overlap with the parts of the bank layer BNL that extend in the first direction DR1 and may be spaced from the other electrodes RME. The first electrode RME1 may be spaced from, and aligned with, the first electrode RME1 of the upper neighboring subpixel SPXn in the first direction DR1, whereas the fourth electrode RME4 may be spaced from, but not aligned with, the fourth electrode RME4 of the upper neighboring subpixel SPXn in the first direction DR1. The fourth electrode RME4 may be disposed to adjoin one side, in the second direction DR1, of the separation part ROP of the subarea SA, may extend in the first direction DR1, and may be bent to adjoin one side, in the first direction DR1, of a separation part ROP of a subarea SA of the lower neighboring subpixel SPXn in the first direction DR1.

The first, third, and fourth electrodes RME1, RME3, and RME4, which are electrodes having the first end portions thereof in the first direction DR1 disposed in the subarea SA, may be disposed even in the separation part ROP of the subarea SA. The second end portions, in the first direction DR1, of the first and fourth electrodes RME1 and RME4 may be disposed even in the separation part ROP of the subarea SA of the lower neighboring subpixel SPXn in the first direction DR1. The first, third, and fourth electrodes RME1, RME3, and RME4 may initially be formed to be connected to one another by an electrode connector CEP (see FIG. 11), which is disposed in the separation part ROP of the subarea SA, and may then be separated from one another later by connecting the electrode connector CEP after the arrangement of the light-emitting elements ED. As a result, both end portions of each of the first, third, and fourth electrodes RME1, RME3, and RME4 may be in contact with the separation parts ROP of different subareas SA.

The electrode connector CEP may be removed from the subarea SA by an etching process using a mask, and during the etching process, electrodes RME adjacent to the separation part ROP may be partially damaged, or a residue of the material of the electrodes RME may remain. However, as the display device 10 includes insulating layers that cover the electrodes RME adjacent to the separation part ROP, parts of the electrodes RME adjacent to the separation part ROP can be prevented from being damaged during an etching process for removing the electrode connector CEP. The etching process for removing the electrode connector CEP may be performed after the formation of the light-emitting elements ED, the first insulating layer PAS1, and the second insulating layer PAS2. The first and second insulating layers PAS1 and PAS2 may be disposed to cover the entire subarea SA except for the separation part ROP and may thus be able to prevent the electrodes RME from being damaged during the etching process. This will be described later.

Parts of the first and third electrodes RME1 and RME3 in the emission area EMA may be disposed on both sides of the first bank part of the first bank pattern BP1, part of the second electrode RME2 in the emission area EMA may be disposed on the second bank pattern BP2, and part of the fourth electrode RME4 in the emission area EMA may be disposed on the third bank pattern BP3. The electrodes RME may generally extend in the first direction DR1, but may be formed to have a relatively large width on the bank patterns BP or to be bent, and the distance between the electrodes RME may be smaller than the distance between the bank patterns BP. In one or more embodiments, the distance between the parts of the second and third electrodes RME2 and RME3 on the bank patterns BP may be smaller than the distance between the first and second bank patterns BP1 and BP2 in the second direction DR2, and the distance between the parts of the first and fourth electrodes RME1 and RME4 on the bank patterns BP may be smaller than the distance between the first and third bank patterns BP1 and BP3 in the second direction DR2. At least parts of the electrodes RME may be disposed directly on the via layer VIA and may thus be placed at the same plane.

The electrodes RME may be disposed on at least inclined side surfaces of the bank patterns BP. In one or more embodiments, the parts of the electrodes RME on the bank patterns BP may have a smaller width than the bank patterns BP in the second direction DR2. The electrodes RME may be disposed to cover at least one side surface of each of the bank patterns BP. Light emitted from the light-emitting elements ED between the bank patterns BP may be reflected by the electrodes RME on the bank patterns BP to be emitted upwardly. The electrodes RME may include a conductive material with high reflectance and may thus be able to reflect light emitted from the light-emitting elements ED.

The first electrode RME1 may include a first electrode extension EP1, which is disposed in the subarea SA, and the first electrode extension EP1 may be in contact with the second conductive pattern CDP2 through the first contact hole CTD, which penetrates the via layer VIA and the first passivation layer PV1. The second electrode RME2 may include a second electrode extension EP2, which is disposed in a lower part of the emission area EMA, and the second electrode extension EP2 may be in contact with the second voltage line VL2 of the third conductive layer through the second contact hole CTS, which penetrates the via layer VIA and the first passivation layer PV1. The first electrode RME1 may be electrically connected to the first transistor T1 through the first and second electrode patterns CDP1 and CDP2 and may thus receive the first power supply voltage, and the second electrode RME2 may be electrically connected to the second voltage line VL2 and may thus receive the second power supply voltage.

As already mentioned above, as the first and third subpixels SPX1 and SPX3 have a different pattern of arrangement of their emission areas EMA and subareas SA from the second subpixel SPX2, the pattern of arrangement of the electrodes RME may vary depending on the type of subpixel SPXn. In each of the first and third subpixels SPX1 and SPX3, the subarea SA may be disposed above the emission area EMA, and the third electrode RME3 may extend downwardly from the third electrode extension EP3. On the contrary, in the second subpixel SPX2, the subarea SA may be disposed below the emission area EMA, and the third electrode RME3 may extend upwardly from the third electrode extension EP3. The pattern of arrangement of the first, second, and fourth electrodes RME1, RME2, and RME4 may also vary depending on the configuration of each subpixel SPXn.

Referring to FIG. 2, as the subareas SA of the first, second, and third subpixels SPX1, SPX2, and SPX3 are spaced diagonally from one another, the first electrode extensions EP1 and the first contact holes CTD of the first electrodes RME1 of the first, second, and third subpixels SPX1, SPX2, and SPX3 may be arranged diagonally with respect to one another. The location of the second conductive patterns CDP2 that are in contact with the first electrodes RME1 of the first, second, and third subpixels SPX1, SPX2, and SPX3 may vary depending on the configuration of the first, second, and third subpixels SPX1, SPX2, and SPX3.

Referring to FIGS. 5-7, the first insulating layer PAS1 may generally be disposed in the entire display area DPA, on the via layer VIA and the electrodes RME. The first insulating layer PAS1 may protect the electrodes RME and may insulate the electrodes RME from one another. As before the formation of the bank layer BNL, the first insulating layer PAS1 is disposed to cover the electrodes RME, the electrodes RME can be prevented from being damaged during the formation of the bank layer BNL. Also, the first insulating layer PAS1 can prevent the light-emitting elements ED from being placed in direct contact with, and damaged by, other members.

The first insulating layer PAS1 may be formed to have a recess at the top surface thereof between each pair of electrodes RME that are spaced from each other in the second direction DR2. The light-emitting elements ED may be disposed on recessed parts of the top surface of the first insulating layer PAS1, and gaps may be formed between the first insulating layer PAS1 and the light-emitting elements ED.

The first insulating layer PAS1 may be disposed to cover the electrodes RME and may include a plurality of openings, which expose parts of the top surface of the electrodes RME. In one or more embodiments, the first insulating layer PAS1 may include a plurality of first, second, third, and fourth contacts CT1, CT2, CT3, and CT4, which expose parts of the top surfaces of the electrodes RME, in the emission area EMA. The first, second, third, and fourth contact CT1, CT2, CT3, and CT4 may be disposed on the first, second, third, and fourth electrodes RME1, RME2, RME3, and RME4, respectively. The connecting electrodes CNE may be in contact with parts of the electrodes RME, exposed through the first, second, third, and fourth contact CT1, CT2, CT3, and CT4. The first, second, third, and fourth contact CT1, CT2, CT3, and CT4 are illustrated as being disposed in the emission area EMA, but the present disclosure is not limited thereto. Alternatively, the first, second, third, and fourth contact CT1, CT2, CT3, and CT4 may be disposed in the subarea SA.

The first insulating layer PAS1 may be disposed in the subarea SA, but not in the separation part ROP, which exposes part of the top surface of the via layer VIA, and may include an opening OP, which exposes part of the first electrode RME1 in the first contact hole CTD. As already mentioned above, the separation part ROP is an area where some of the electrodes RME are spaced from other electrodes RME and where the electrodes RME are separated during the fabrication of the display device 10. The opening OP may expose part of the first electrode RME1 in the first contact hole CTD. As the opening OP exposes the first electrode RME1, part of the first electrode RME1, exposed by the opening OP, may be damaged during an etching process for separating the electrodes RME in the separation part ROP or may remain after the etching process. This can be addressed by covering the opening OP with the second insulating layer PAS2.

The bank layer BNL may be disposed on the first insulating layer PAS1. The bank layer BNL may include parts that extend in the first direction DR1 and parts that extend in the second direction DR2 and may be around (or surround) each subpixel SPXn. Also, the bank layer BNL may be around (or surround) and separate the emission area EMA and the subarea SA of each subpixel SPXn and may separate the display area DPA and the non-display area NDA by surrounding the outermost parts of the display area DPA. The bank layer BNL may be disposed in the entire display area DPA to form a lattice pattern, and parts of the display area DPA, opened by the bank layer BNL may be the emission area EMA and the subarea SA of each subpixel SPXn.

The bank layer BNL, like the bank patterns BP, may have a suitable height (e.g., a predetermined height). In one or more embodiments, the top surface of the bank layer BNL may have a greater height than the bank patterns BP in the third direction DR3, and the thickness of the bank layer BNL may be the same as, or greater than, the thickness of the bank patterns BP. The bank layer BNL may prevent ink from spilling over between neighboring subpixels SPXn in an inkjet printing process during the fabrication of the display device 10. The bank layer BNL, like the bank patterns BP, may include an organic insulating material such as PI.

The light-emitting elements ED may be disposed on the first insulating layer PAS1. The light-emitting elements ED may extend in one direction, and the direction in which the light-emitting elements ED extend may be parallel to the first substrate SUB. As will be described later, each of the light-emitting elements ED may include a plurality of semiconductor layers that are arranged in the direction in which the light-emitting elements ED extend. The semiconductor layers may be sequentially arranged in a direction parallel to the top surface of the first substrate SUB, but the present disclosure is not limited thereto. Alternatively, the semiconductor layers may be arranged in a direction perpendicular to the first substrate SUB.

The light-emitting elements ED may be disposed between each pair of electrodes RME that are spaced from each other along the second direction DR2, between the bank patterns BP. The length of the light-emitting elements ED may be greater than the distance, in the second direction DR2, between the electrodes RME. At least one end portion of each of the light-emitting elements ED may be disposed on one of the electrodes RME, or respective end portions of each of the light-emitting elements ED may be disposed on respective electrodes RME. In one or more embodiments, the light-emitting elements ED may include first light-emitting elements ED1, which are disposed between the first and third bank patterns BP1 and BP3, on the first and fourth electrodes RME1 and RME4, and second light-emitting elements ED2, which are disposed between the first and second bank patterns BP1 and BP2, on the second and third electrodes RME2 and RME3. The light-emitting elements ED may be arranged such that the direction in which the electrodes RME extend and the direction in which the light-emitting elements ED extend may substantially form a right angle with each other. The light-emitting elements ED may be spaced from one another in the direction in which the electrodes RME extend, i.e., in the first direction DR1, and may be aligned substantially in parallel to one another, but the present disclosure is not limited thereto. Alternatively, the light-emitting elements ED may be arranged at an inclination with respect to the direction in which the electrodes RME extend.

The light-emitting elements ED may emit light of different wavelength ranges depending on the materials of the semiconductor layers thereof, but the present disclosure is not limited thereto. Alternatively, the semiconductor layers of each of the light-emitting elements ED may include the same material so that the light-emitting elements ED may emit light of the same color.

The second insulating layer PAS2 may be disposed on the light-emitting elements ED, the first insulating layer PAS1, and the bank layer BNL. The second insulating layer PAS2 may include pattern parts that extend in the first direction DR1 between the bank patterns BP and are disposed on the light-emitting elements ED. The pattern parts may be disposed to be around (or surround) parts of the outer surfaces of each of the light-emitting elements ED and may not cover both sides or both end portions of each of the light-emitting elements ED. The pattern parts may form linear or island patterns in each subpixel SPXn in a plan view. The pattern parts of the second insulating layer PAS2 may protect and fix the light-emitting elements ED during the fabrication of the display device 10. The second insulating layer PAS2 may be disposed to fill the gaps between the first insulating layer PAS1 and the light-emitting elements ED.

The second insulating layer PAS2 may not be disposed on, but expose, the first, second, third, and fourth contacts CT1, CT2, CT3, and CT4, in the emission area EMA. Part of the second insulating layer PAS2 may be disposed in the subarea SA. The part of the second insulating layer PAS2 in the subarea SA may not be disposed in the separation part ROP, but may cover the opening OP.

The connecting electrodes CNE may be disposed on, and in contact with, the electrodes RME and the light-emitting elements ED. The connecting electrodes CNE may be in contact with one end portion of each of the light-emitting elements ED and with at least one of the electrodes RME through the first, second, third, and fourth contacts CT1, CT2, CT3, and CT4, which penetrate the first insulating layer PAS1.

The first connecting electrode CNE1 may extend in the first direction DR1 and may be disposed on the first electrode RME1. The first connecting electrode CNE1 may overlap with part of the first electrode RME1 on the first bank part of the first bank pattern BP1. The first connecting electrode CNE1 may be in contact with the first electrode RME1 through the first contact CT1, in the emission area EMA. Also, the first connecting electrode CNE1 may be in contact with first end portions of the first light-emitting elements ED1 and may transmit electrical signals applied thereto from the first transistor T1 to the light-emitting elements ED.

The second connecting electrode CNE2 may extend in the first direction DR1 and may be disposed on the second electrode RME2. The second connecting electrode CNE2 may overlap with part of the second electrode RME2 on the second bank pattern BP2. The second connecting electrode CNE2 may be in contact with the second electrode RME2 through the second contact CT2, in the emission area EMA. Also, the second connecting electrode CNE2 may be in contact with first end portions of the second light-emitting elements ED2 and may transmit electrical signals applied thereto from the second voltage line VL2 to the light-emitting elements ED.

The third connecting electrode CNE3 may be disposed on the third and fourth electrodes RME3 and RME4. The third connecting electrode CNE3 may include first and second extensions CN_E1 and CN_E2, which extend in the first direction DR1, and a plurality of first connectors CN_B1, which connect the first and second extensions CN_E1 and CN_E2. The third connecting electrode CNE3 may be around (or surround) the first connecting electrode CNE1.

The first extension CN_E1 may overlap with part of the fourth electrode RME4 on the third bank pattern BP3, and the second extension CN_E2 may overlap with part of the third electrode RME3 on the first bank pattern BP1. The first extension CN_E1 may be spaced from, and oppose (or face), the first connecting electrode CNE1, and the second extension CN_E2 may be spaced apart from, and oppose (or face), the second connecting electrode CNE2. The first extension CN_E1 may be in contact with part of the fourth electrode RME4, exposed through the fourth contact CT4, and the second extension CN_E2 may be in contact with part of the third electrode RME3, exposed through the third contact CT3. The first extension CN_E1 may be in contact with the first light-emitting elements ED1, and the second extension CN_E2 may be in contact with the second light-emitting elements ED2. The third and fourth electrodes RME3 and RME4 may receive electrical signals through the third connecting electrode CNE3.

The first connectors CN_B1 may be disposed on both sides, in the first direction DR1, of the first connecting electrode CNE1. The length, in the first direction DR1, of the first and second extensions CN_E1 and CN_E2 may be greater than the length, in the first direction DR1, of the first connecting electrode CNE1, and the third connecting electrode CNE3 may have a rectangular shape around (or surrounding) the first connecting electrode CNE1, in a plan view.

The third insulating layer PAS3 may be disposed on the third connecting electrode CNE3 and the second insulating layer PAS2. The third insulating layer PAS3 may be disposed on the entire surface of the second insulating layer PAS2 to cover the third connecting electrode CNE3, and the first and second connecting electrodes CNE1 and CNE2 may be disposed on the third insulating layer PAS3. The third insulating layer PAS3 may be disposed on the entire surface of the via layer VIA except for a region where the first and second connecting electrodes CNE1 and CNE2 are disposed. The third insulating layer PAS3 may insulate the first and second connecting electrodes CNE1 and CNE2 from the third connecting electrodes CNE3 so that the first and second connecting electrodes CNE1 and CNE2 may not be in direct contact with the third connecting electrodes CNE3.

The third insulating layer PAS3 may be disposed in the entire subarea SA and may cover the separation part ROP. The third insulating layer PAS3 may be in direct contact with parts of the top surface of the via layer VIA, exposed between the electrodes RME, which are spaced from one another in the separation part ROP.

In one or more embodiments, an additional insulating layer may be further disposed on the third insulating layer PAS3 and the first connecting electrode CNE1. The additional insulating layer may protect the elements disposed on the first substrate SUB from an external environment.

The first, second, and third insulating layers PAS1, PAS2, and PAS3 may include an inorganic insulating material or an organic insulating material.

Figure 8:
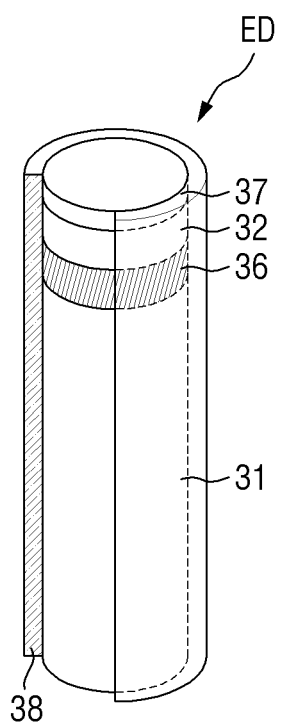
FIG. 8 is a perspective view of a light-emitting element according to one or more embodiments of the present disclosure.

FIG. 8 is a perspective view of a light-emitting element according to one or more embodiments of the present disclosure.

Referring to FIG. 8, a light-emitting element ED may be a light-emitting diode (LED), for example, an ILED having a size of several nanometers or micrometers and formed of an inorganic material. If an electric field is formed in a particular direction between two opposite electrodes, the light-emitting element ED may be aligned between the two electrodes where polarities are formed.

The light-emitting element ED may have a shape that extends in one direction. The light-emitting element ED may have the shape of a cylinder, a rod, a wire, or a tube, but the shape of the light-emitting element ED is not particularly limited. Alternatively, the light-emitting element ED may have the shape of a polygonal column such as a regular cube, a rectangular parallelepiped, or a hexagonal column or may have a shape that extends in one direction but with a partially inclined outer surface.

The light-emitting element ED may include semiconductor layers doped with impurities of an arbitrary conductivity type (e.g., a p type or an n type). The semiconductor layers may receive electrical signals from an external power source to emit light of a particular wavelength range. The light-emitting element ED may include a first semiconductor layer 31, a second semiconductor layer 32, the light-emitting layer 36, an electrode layer 37, and an insulating film 38.

The first semiconductor layer 31 may include an n-type semiconductor. The first semiconductor layer 31 may include a semiconductor material, i.e., $Al_xGa_yIn_{1-x-y}N$ (where $0 \le x \le 1$, $0 \le y \le 1$, and $0 \le x+y \le 1$). In one or more embodiments, the first semiconductor layer 31 may include at least one of AlGaInN, GaN, AlGaN, InGaN, AlN, and InN that are doped with an n-type dopant. The n-type dopant may be Si, Ge, or Sn.

The second semiconductor layer 32 may be disposed on the first semiconductor layer 31 with the light-emitting layer 36 interposed therebetween. The second semiconductor layer 32 may include a p-type semiconductor. The second semiconductor layer 32 may include a semiconductor material, i.e., $Al_xGa_yIn_{1-x-y}N$ (where $0 \le x \le 1$, $0 \le y \le 1$, and $0 \le x+y \le 1$). In one or more embodiments, the second semiconductor layer 32 may include at least one of AlGaInN, GaN, AlGaN, InGaN, AlN, and InN that are doped with a p-type dopant. The p-type dopant may be Mg, Zn, Ca, Se, or Ba.

FIG. 8 illustrates that the first and second semiconductor layers 31 and 32 are formed as single layers, but the present disclosure is not limited thereto. Alternatively, each of the first and second semiconductor layers 31 and 32 may include more than one layer such as, for example, a clad layer or a tensile strain barrier reducing (TSBR) layer, depending on the material of the light-emitting layer 36.

The light-emitting layer 36 may be disposed between the first and second semiconductor layers 31 and 32. The light-emitting layer 36 may include a single- or multi-quantum well structure material. In a case where the light-emitting layer 36 includes a material having a multi-quantum well structure, the light-emitting layer 36 may have a structure in which multiple quantum layers and multiple well layers are alternately stacked. The light-emitting layer 36 may emit light by combining electron-hole pairs in accordance with electrical signals applied thereto via the first and second semiconductor layers 31 and 32. The light-emitting layer 36 may include a material such as AlGaN or AlGaInN. For example, in a case where the light-emitting layer 36 has a multi-quantum well structure in which multiple quantum layers and multiple well layers are alternately stacked, the quantum layers may include a material such as AlGaN or AlGaInN, and the well layers may include a material such as GaN or AlInN.

The light-emitting layer 36 may have a structure in which a semiconductor material having a large band gap energy and a semiconductor material having a small band gap energy are alternately stacked or may include Group-III or Group-V semiconductor materials depending on the wavelength of light to be emitted. The type of light emitted by the light-emitting layer 36 is not particularly limited. The light-emitting layer 36 may emit light of a red or green wavelength range as necessary, instead of blue light.

The electrode layer 37 may be disposed on the second semiconductor layer 32. The electrode layer 37 may be an ohmic connecting electrode, but the present disclosure is not limited thereto. Alternatively, the electrode layer 37 may be a Schottky connecting electrode. The light-emitting element ED may include at least one electrode layer 37. The light-emitting element ED may include more than one electrode layer 37, but the present disclosure is not limited thereto. Alternatively, the electrode layer 37 may not be provided.

The electrode layer 37 may reduce the resistance between the light-emitting element ED and electrodes RME or (connecting electrodes CNE) when the light-emitting element ED is electrically connected to the electrodes RME or (the connecting electrodes CNE). The electrode layer 37 may include a conductive metal. In one or more embodiments, the electrode layer 37 may include at least one of Al, Ti, In, gold (Au), Ag, ITO, IZO, and ITZO.

The insulating film 38 may be disposed to be around (or surround) outer surfaces (e.g., outer peripheral or circumferential surfaces) of the first and second semiconductor layers 31 and 32, the active layer 36, and the electrode layer 37. In one or more embodiments, the insulating film 38 may be disposed to be around (or surround) at least an outer surface (e.g., an outer peripheral or circumferential surface) of the light-emitting layer 36, but may expose both end portions, in the length direction, of the light-emitting element ED. The insulating film 38 may be formed to be rounded in a cross-sectional view, in a region adjacent to at least one end of the light-emitting element ED.

The insulating film 38 may include a material with insulating properties such as, for example, silicon oxide ($SiO_x$), silicon nitride ($SiN_x$), silicon oxynitride ($SiO_xN_y$), aluminum nitride ($AlN_x$), or aluminum oxide ($AlO_x$). The insulating film 38 is illustrated as being a single-layer film, but the present disclosure is not limited thereto. Alternatively, in one or more embodiments, the insulating film 38 may be formed as a multilayer film in which multiple layers are stacked.

The insulating film 38 may protect the other elements of the light-emitting element ED. The insulating film 38 can prevent any short circuit that may occur in the light-emitting element 36 in case that the light-emitting element ED is in direct contact with electrodes to which electrical signals are applied. Also, the insulating film 38 can prevent the degradation of the emission efficiency of the light-emitting element ED.

The outer surface (e.g., the outer peripheral or circumferential surface) of the insulating film 38 may be subjected to surface treatment. The light-emitting element ED may be sprayed on electrodes while being dispersed in ink (e.g., a predetermined ink). Here, the surface of the insulating film 38 may be hydrophobically or hydrophilically treated to keep the light-emitting element ED dispersed in ink without agglomerating with other neighboring light-emitting elements ED.

Figure 9:
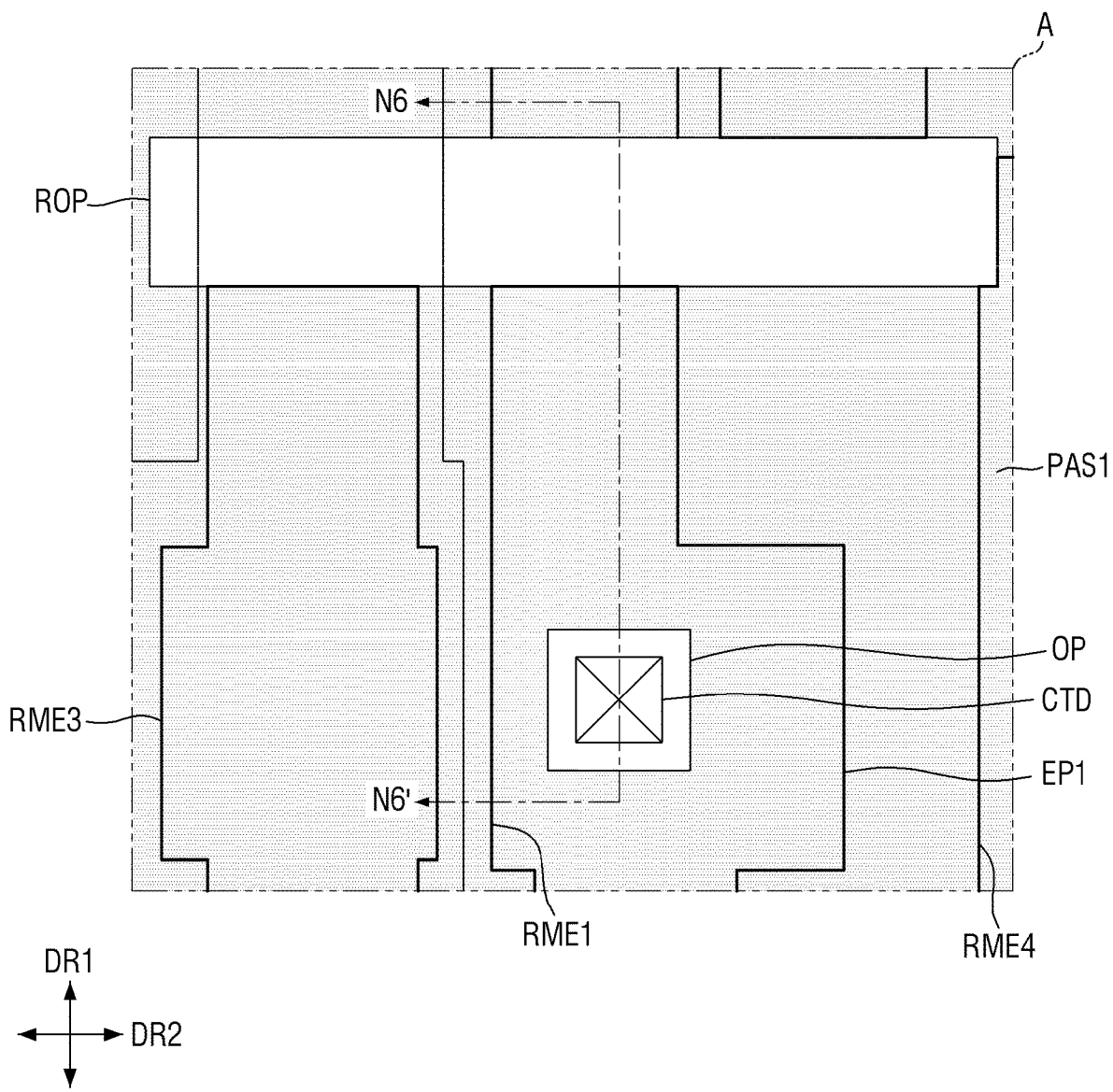
FIG. 9 is an enlarged plan view of part A of FIG. 4.
Figure 10:
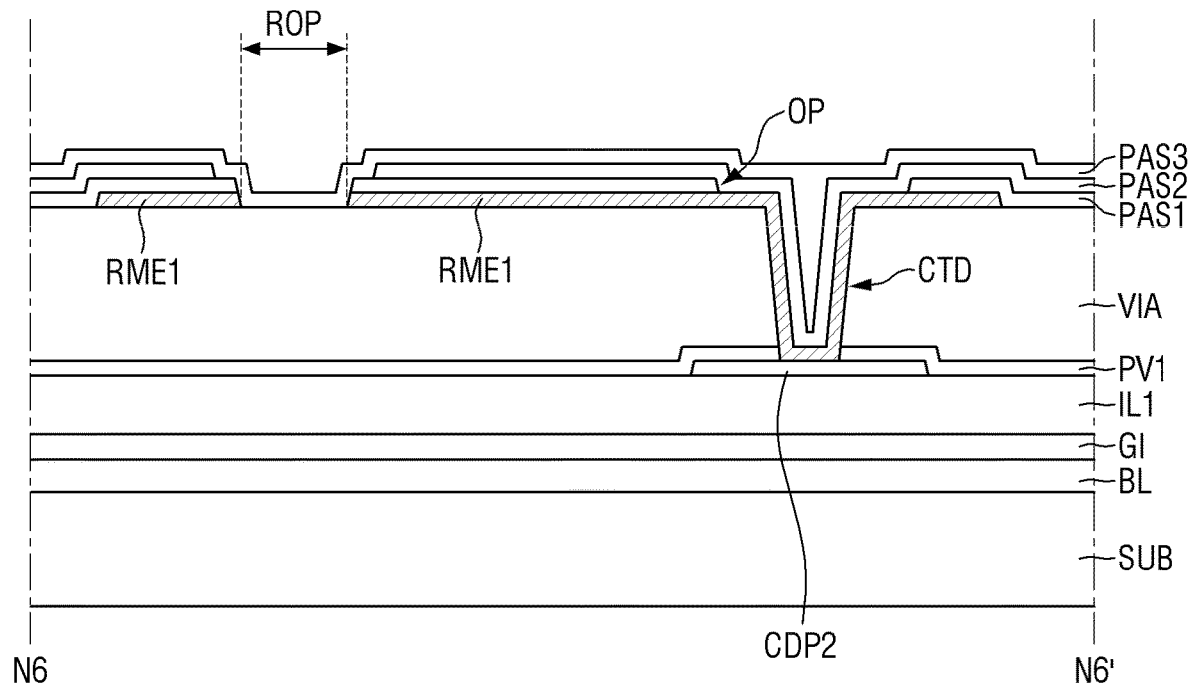
FIG. 10 is a cross-sectional view taken along the line N6-N6' of FIG. 9.

FIG. 9 is an enlarged plan view of part A of FIG. 4. FIG. 10 is a cross-sectional view taken along the line N6-N6' of FIG. 9. FIG. 10 illustrates a cross-sectional view taken across a separation part ROP and an opening OP of a first insulating layer PAS1.

Referring to FIGS. 9 and 10, parts of the electrodes RME may be disposed in the subarea SA, and the first, second, and third insulating layers PAS1, PAS2, and PAS3 may be disposed on the parts of the electrodes RME. At least parts of the electrodes RME may be disposed in the subarea SA, and first ends, in the first direction DR1, of the first, third, and fourth electrodes RME1, RME3, and RME4 may be disposed to adjoin the separation part ROP. The second electrode RME2 may be spaced from the separation part ROP of the subarea SA and may be disposed across multiple subpixels SPXn arranged along the first direction DR1, including the first subpixel SPX1, without being divided in the subarea SA.

The removal of the electrode connector CEP, which connects some of the electrodes RME in the separation part ROP of the subarea SA, is performed. The first, third, and fourth electrodes RME1, RME3, and RME4 may initially be formed to be connected to one another by the electrode connector CEP in the subarea SA and may be separated later from one another by removing the electrode connector CEP after the formation of the second insulating layer PAS2. Accordingly, in the separation part ROP of the subarea SA, the first and second insulating layers PAS1 and PAS2 may not be disposed, and the third insulating layer PAS3 may cover the separation part ROP. The third insulating layer PAS3 may be in direct contact with the top surface of the via layer VIA, in the separation part ROP, and with ends of the first electrodes RME1 separated by the separation part ROP. The first electrodes RME1 separated by the separation part ROP may be the first electrodes RME1 of different subpixels SPXn spaced from each other in the first direction DR1.

The first insulating layer PAS1 is not disposed in the separation part ROP of the subarea SA and includes the opening OP, which exposes part of the first electrode extension EP1. The opening OP may be disposed to overlap with the first contact hole CTD, and the diameter of the opening OP may be greater than the diameter of the first contact hole CTD. The area of the separation part ROP where the first insulating layer PAS1 is not disposed may be greater than the area of the opening OP. As the separation part ROP is for removing the electrode connector CEP and the opening OP is formed to correspond to the first contact hole CTD, the separation part ROP and the opening OP have different areas. If the removal of the electrode connector CEP is performed with part of the first electrode extension EP1 exposed by the opening OP of the first insulating layer PAS1, part of the first electrode extension EP1 may be removed, or part of the electrode connector CEP may remain in the opening OP, causing electrical connection error in the first subpixel SPX1. To prevent this, the second insulating layer PAS2 may be disposed to cover part of the subarea SA other than the separation part ROP, for example, the opening OP of the first insulating layer PAS1.

As illustrated in FIGS. 9 and 10, the second insulating layer PAS2 may cover the entire subarea SA except for the separation part ROP. The second insulating layer PAS2 may be disposed throughout the emission area EMA and the subarea SA to expose the separation part ROP and both end portions of each of the light-emitting elements ED. The second insulating layer PAS2 may cover the opening OP and may be in direct contact with the first electrode extension EP1. The removal of the electrode connector CEP from the subarea SA may be performed with the first and second insulating layers PAS1 and PAS2 not disposed only in the separation part ROP, and areas other than the separation part ROP may be protected by the second insulating layer PAS2. Accordingly, damage to the electrodes RME or connection error that may be caused by any residues can be prevented, and the size of the separation part ROP, which is exposed by the first and second insulating layers PAS1 and PAS2, can be reduced or minimized.

Figure 11:
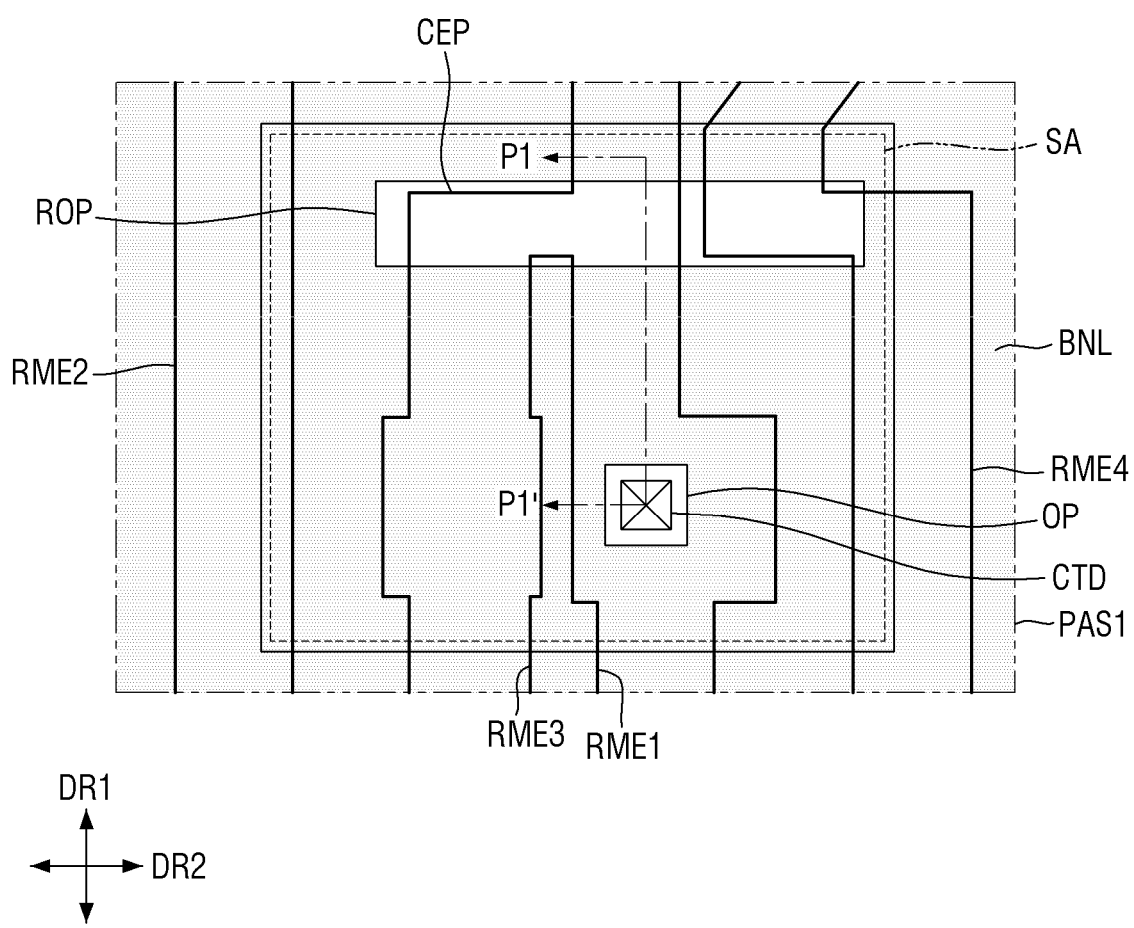
FIGS. 11-14 are plan views or cross-sectional views illustrating the shapes of electrodes in a subarea during the fabrication of the display device of FIG. 1.
Figure 12:
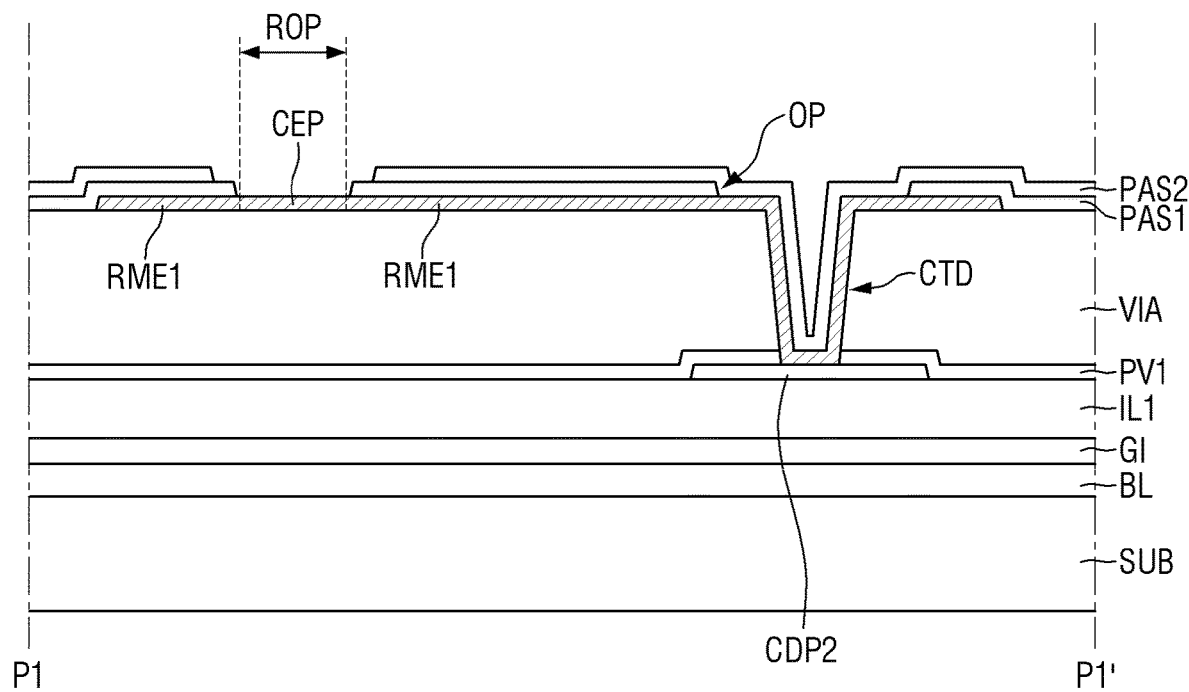
Figure 13:
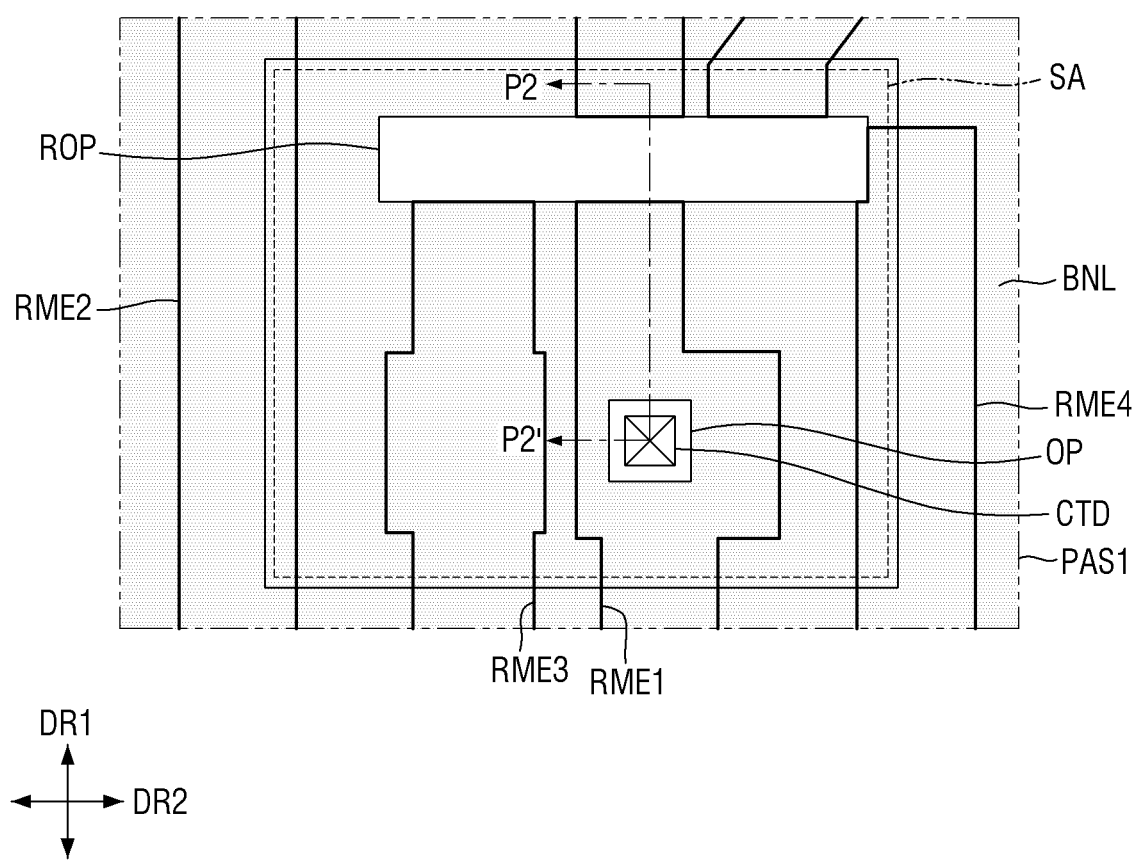
Figure 14:
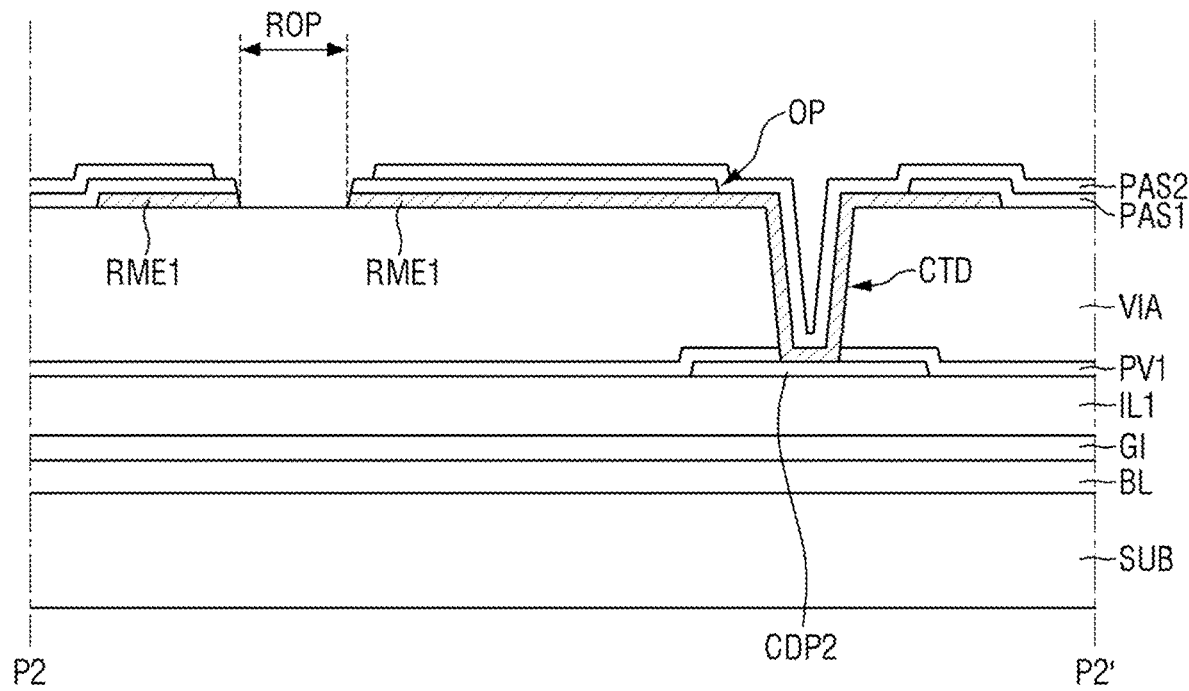

FIGS. 11-14 are plan views or cross-sectional views illustrating the shapes of electrodes in a subarea during the fabrication of the display device of FIG. 1. FIGS. 11 and 13 are plan views illustrating how some electrodes RME that are initially connected by an electrode connector CEP are separated in a subarea SA, and FIGS. 12 and 14 are cross-sectional views taken along the lines P1-P1' of FIGS. 11 and P2-P2' of FIG. 13, respectively, and illustrate cross-sectional views taken across a separation part ROP and an opening OP.

Referring to FIGS. 11 and 12, some of a plurality of electrodes RME, i.e., first and third electrodes RME1 and RME3, may initially be formed in each subpixel SPXn to be connected by an electrode connector CEP. The electrode connector CEP may extend in the second direction DR2, may be disposed in a subarea SA, and may connect some of the electrodes RME that are spaced from each other in the second direction DR2. However, second and fourth electrodes RME2 and RME4 may be spaced from the electrode connector CEP along the second direction DR2 and may not be connected to other electrodes RME. As the electrode connector CEP is removed later, a separation part ROP of the subarea SA may be set as an area where the electrode connector CEP is disposed.

The first insulating layer PAS1 may be disposed to cover the electrodes RME, but expose the electrode connector CEP and part of a first electrode extension EP1. The area where the electrode connector CEP is disposed may become the separation part ROP, and the first insulating layer PAS1 may not be disposed in the separation part ROP. The first insulating layer PAS1 may include an opening OP, which exposes part of the first electrode extension EP1 that overlaps with a first contact hole CTD.

Light-emitting elements ED may be arranged in an emission area EMA by applying electrical signals to the electrodes RME after the formation of the first insulating layer PAS1. The light-emitting elements ED may be placed on each pair of electrodes RME that are spaced from each other along the second direction DR2, in response to electrical signals applied to the second and fourth electrodes RME2 and RME4 and to the other electrodes RME. As the first and third electrodes RME1 and RME3 are connected by the electrode connector CEP, electrical signals may be applied to the first and third electrodes RME1 and RME3 at the same time. The light-emitting elements ED may be placed on the electrodes RME, receiving a force from an electric field formed between the first and fourth electrodes RME1 and RME4 and on the second and third electrodes RME2 and RME3, but the present disclosure is not limited thereto. Alternatively, the light-emitting elements ED may be disposed even between the electrodes RME that are connected to one another, by controlling how to apply electrical signals to the electrodes RME.

Thereafter, the second insulating layer PAS2 may be disposed to cover the light-emitting elements ED. The second insulating layer PAS2 may cover the emission area EMA and the subarea SA, but may not be disposed in the separation part ROP. As the removal of the electrode connector CEP is performed in the separation part ROP, the second insulating layer PAS2 may expose the electrode connector CEP. On the contrary, in the subarea SA, as the second insulating layer PAS2 covers the opening OP of the first insulating layer PAS1, the first electrode extension EP1 may not be completely exposed.

In the emission area EMA, the second insulating layer PAS2 may initially be formed to completely cover both end portions of each of the light-emitting elements ED and may be patterned later to expose both end portions of each of the light-emitting elements ED.

Thereafter, referring to FIGS. 13 and 14, the electrode connector CEP is removed from the separation part ROP where the first and second insulating layers PAS1 and PAS2 are not disposed. The removal of the electrode connector CEP may be performed through patterning using a mask that fits the shape of the separation part ROP or using the first insulating layer PAS1, which exposes the electrode connector CEP, as a mask.

As the entire subarea SA except for the separation part ROP is covered by the second insulating layer PAS2 during the removal of the electrode connector CEP, damage to the electrodes RME that may be caused by residues from patterning can be prevented. For example, as the second insulating layer PAS2 covers the opening OP, the first electrode extension EP1, which overlaps with the first contact hole CTD, can be protected. Also, the first, third, and fourth electrodes RME1, RME3, and RME4, which are initially formed to be connected to one another by the electrode connector CEP, can be separated simply by removing the electrode connector CEP. That is, even if the separation part ROP is only as large as the electrode connector CEP, the first, third, and fourth electrodes RME1, RME3, and RME4 can be properly separated from one another the separation part ROP.

As the second insulating layer PAS2 is disposed to cover the entire subarea SA except for the separation part ROP, the first electrode RME1, which is connected to the third conductive layer through the first contact hole CTD, can be prevented from being damaged or leaving any residues during the separation of the electrodes RME. Also, as electrodes RME to be separated, for example, the first, third, and fourth electrodes RME1, RME3, and RME4, are initially formed to be connected by the electrode connector CEP, the size of the separation part ROP, which is for separating the electrodes RME, can be reduced or minimized such that the separation part ROP may be only as large as the electrode connector CEP, depending on the layout of the second insulating layer PAS2.

The display device 10 may have various configurations and layouts of pixels PX and electrodes RME, other than those illustrated in FIGS. 2, and the layout of a separation part ROP and an opening OP in a subarea SA of each subpixel SPXn may vary accordingly.

Figure 15:
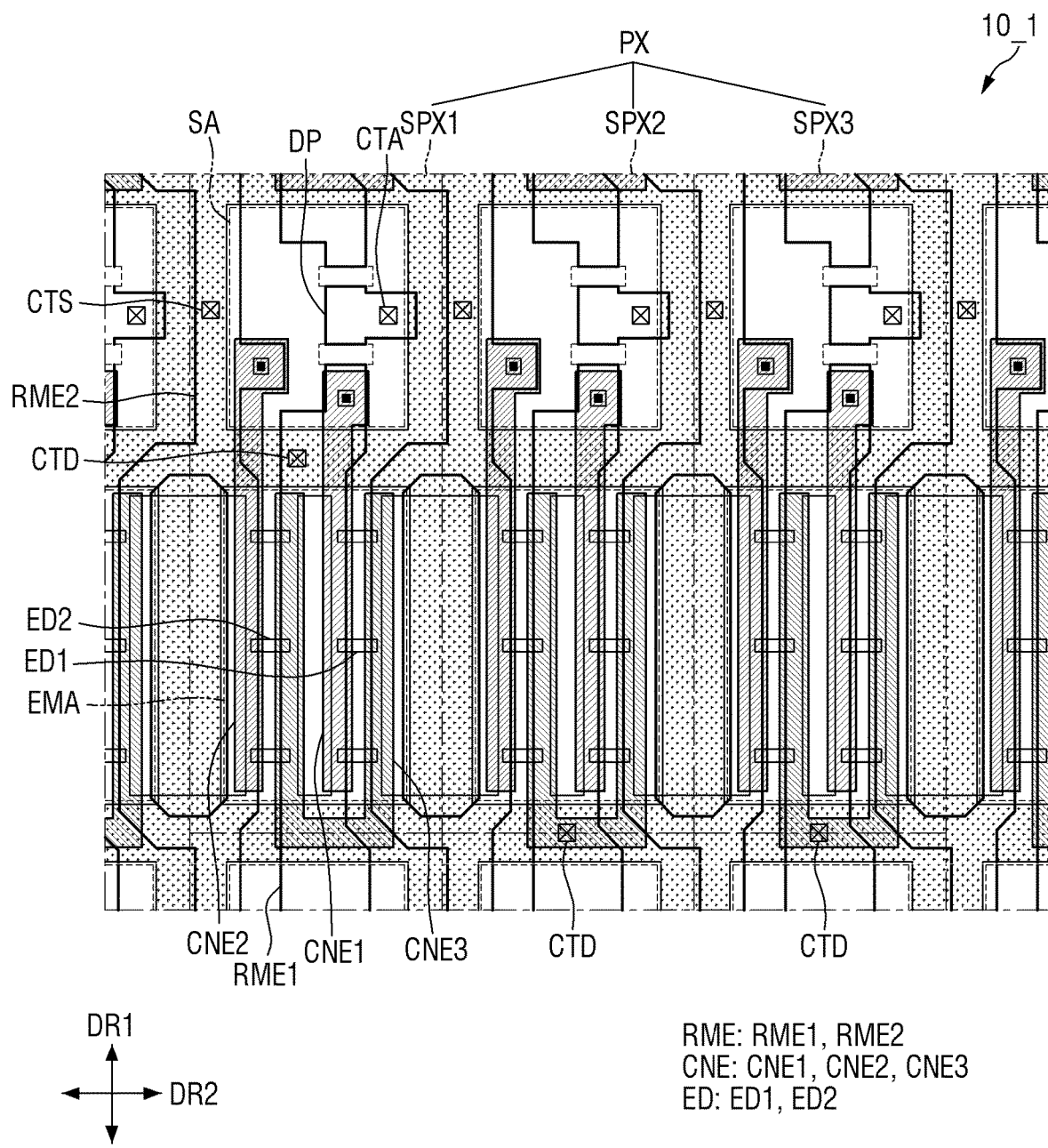
FIG. 15 is a plan view of a pixel of a display device according to one or more embodiments of the present disclosure.
Figure 16:
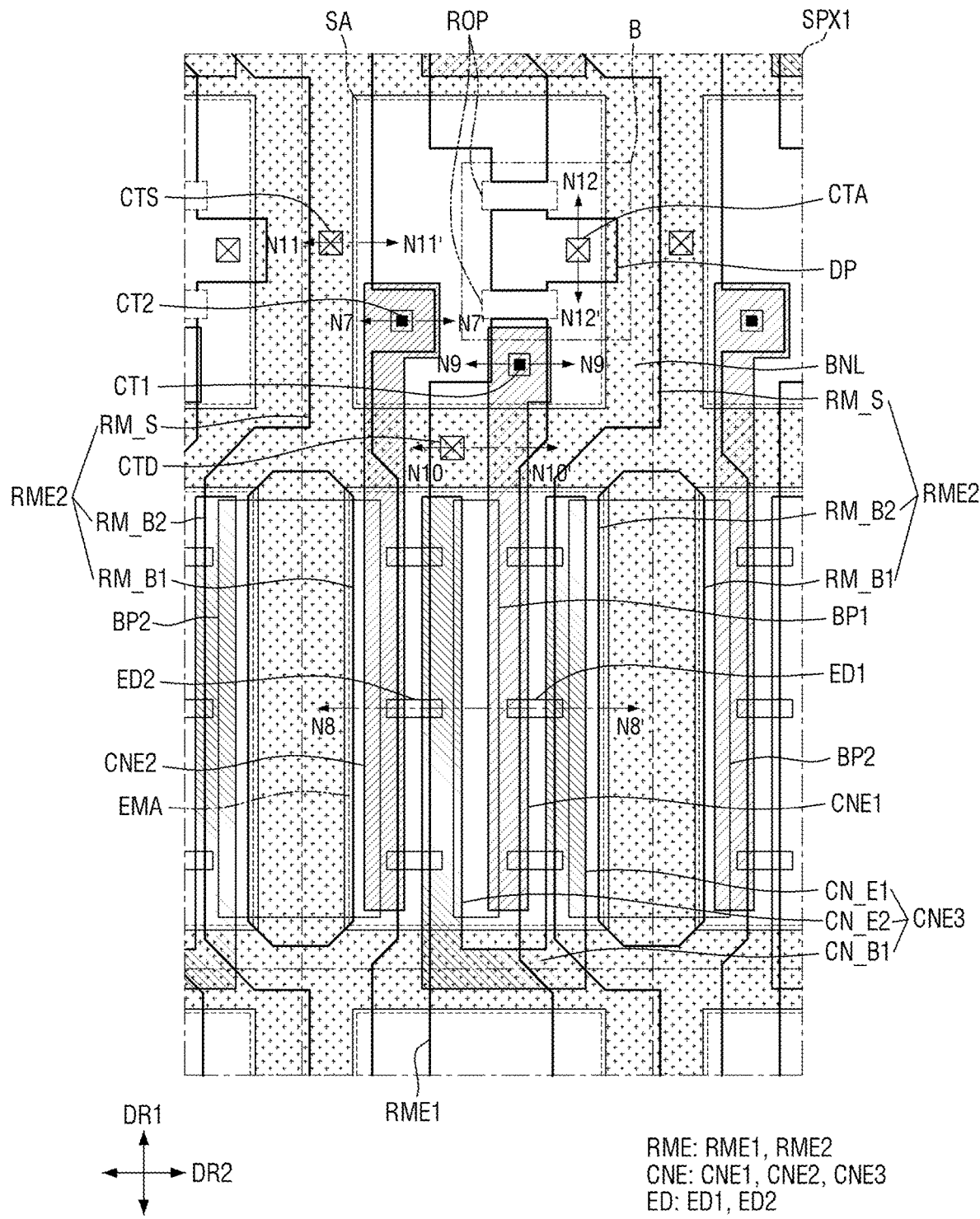
FIG. 16 is a plan view of a first subpixel of FIG. 15.
Figure 17:
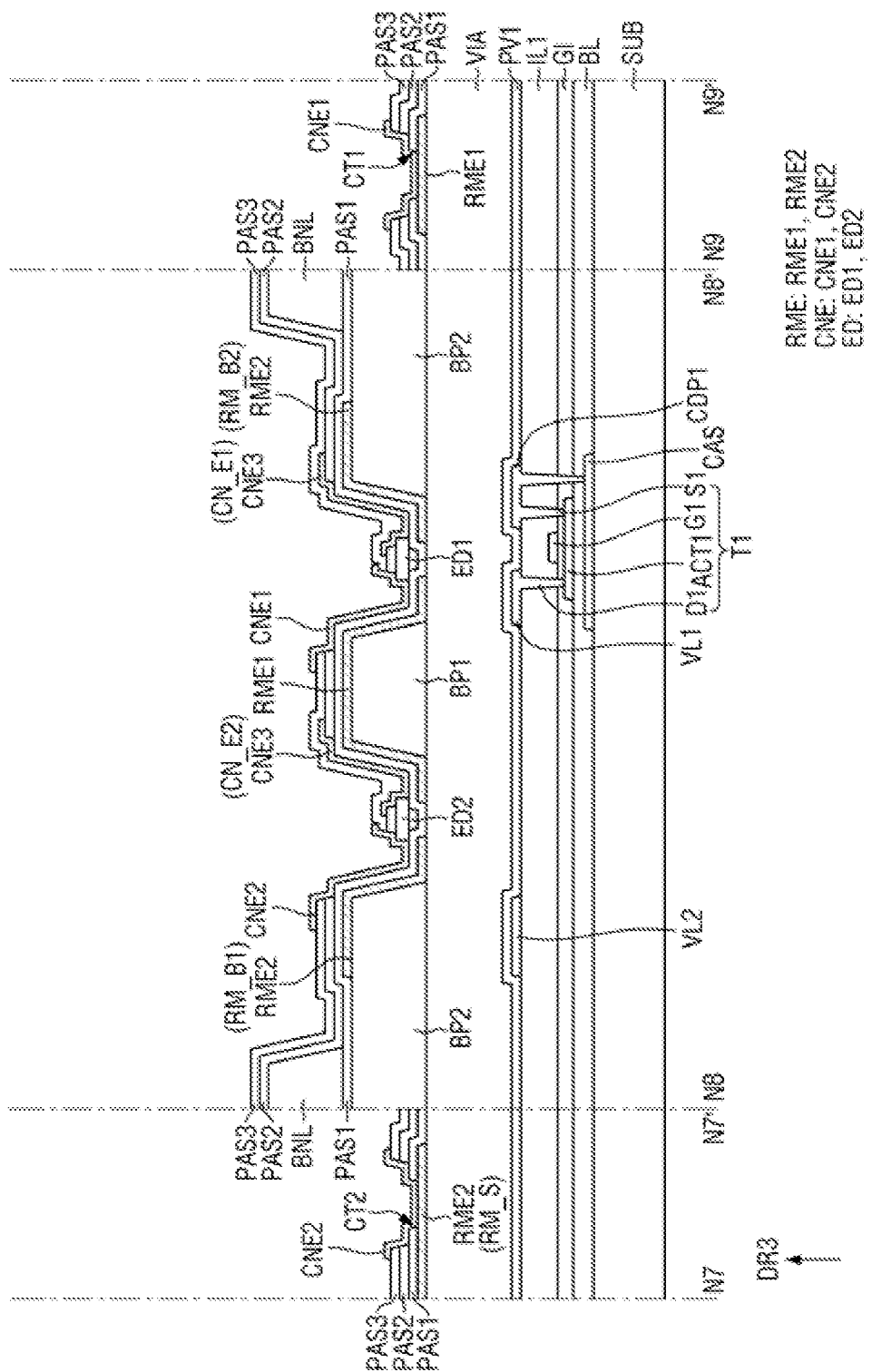
FIG. 17 is a cross-sectional view taken along the lines N7-N7', N8-N8', and N9-N9' of FIG. 16.
Figure 18:
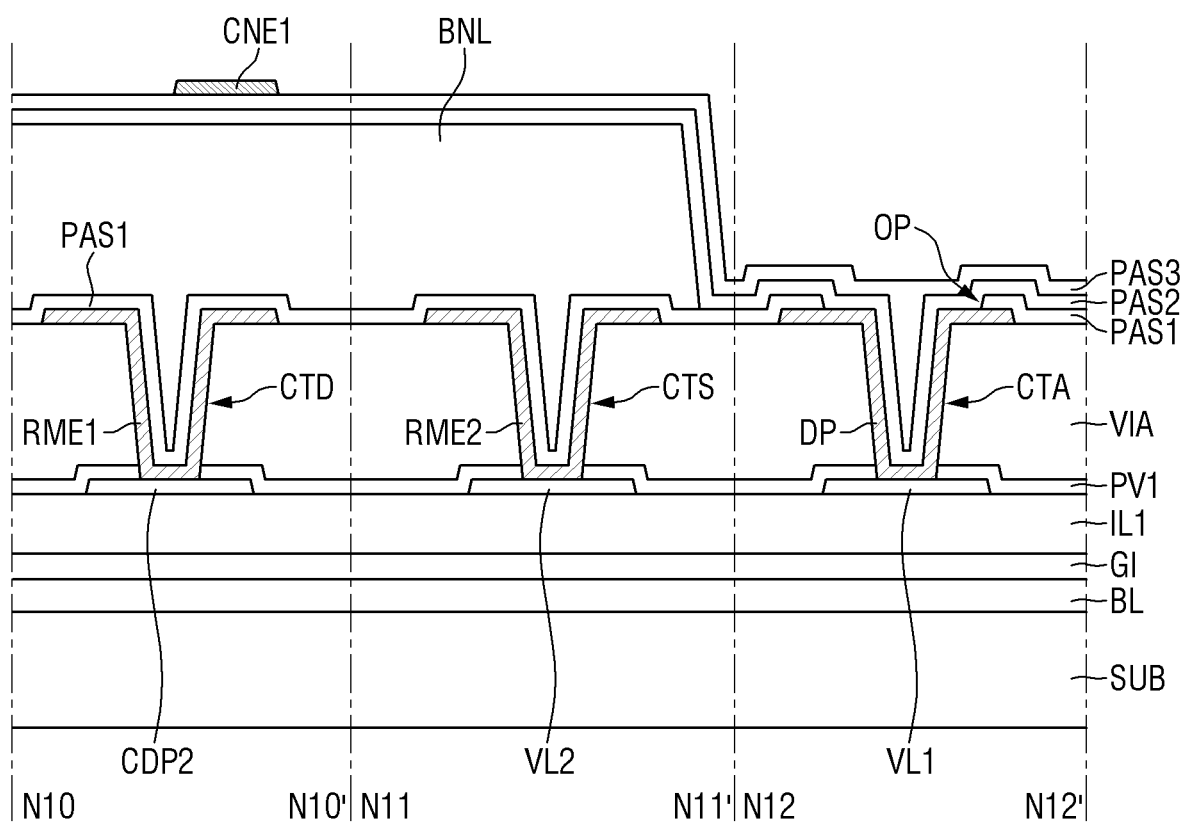
FIG. 18 is a cross-sectional view taken along the lines N10-N10', N11-N11', and N12-N12' of FIG. 16.

FIG. 15 is a plan view of a pixel of a display device according to one or more embodiments of the present disclosure. FIG. 16 is a plan view of a first subpixel of FIG. 15. FIG. 17 is a cross-sectional view taken along the lines N7-N7', N8-N8', and N9-N9' of FIG. 16. FIG. 18 is a cross-sectional view taken along the lines N10-N10', N11-N11', and N12-N12' of FIG. 16. FIG. 17 illustrates a cross-sectional view taken across first and second light-emitting elements ED1 and ED2 and first and second contacts CT1 and CT2 in a first subpixel SPX1 of FIG. 16. FIG. 18 illustrates a cross-sectional view taken across first, second, and third contact holes CTD, CTS, and CTA in the first subpixel SPX1.

Referring to FIGS. 15-18, a pixel PX of a display device 10_1 has a different configuration from the pixel PX of FIG. 2 and includes different layouts of electrodes RME, bank patterns BP, a bank layer BNL, and connecting electrodes CNE from the pixel PX of FIG. 2.

The bank layer BNL may extend in first and second directions DR1 and DR2 and may be arranged in a lattice pattern (e.g., a perfect lattice pattern). Areas surrounded by parts of the bank layer BNL that extend in the first direction DR1 and parts of the bank layer BNL that extend in the second direction DR2 may become emission areas EMA and subareas SA of first, second, and third subpixels SPX1, SPX2, and SPX3. Accordingly, the first, second, and third subpixels SPX1, SPX2, and SPX3 may have substantially the same configuration. In the embodiments of FIGS. 15-18, unlike in the embodiment of FIG. 2, the subareas SA may be disposed on first sides, in the first direction DR1, of the emission areas EMA, i.e., on the upper sides of the emission areas EMA, and the emission areas EMA or the subareas SA may be arranged side-by-side along the second direction DR2.

The bank patterns BP may extend in the first direction DR1 and may be shorter than the emission areas EMA in the first direction DR1. The bank patterns BP may have different widths in the second direction DR2, and some of the bank patterns BP may be disposed across two adjacent subpixels SPXn in the second direction DR2. In one or more embodiments, the bank patterns BP may include first bank patterns BP1, which are disposed in the emission areas EMA, and second bank patterns BP2, which are each disposed in two different neighboring subpixels SPXn in the second direction DR2.

In each of the first, second, and third subpixels SPX1, SPX2, and SPX3, a first bank pattern BP1 may be disposed in the middle of the emission area EMA, and second bank patterns BP2 may be spaced from each other with the first bank pattern BP1 interposed therebetween. First bank patterns BP1 and second bank patterns BP2 may be alternately arranged along the second direction DR2 across the first, second, and third subpixels SPX1, SPX2, and SPX3. Light-emitting elements ED may be disposed in the gaps between the first bank patterns BP1 and the second bank patterns BP2.

The first bank patterns BP1 and the second bank patterns BP2 may have the same length in the first direction DR1, but may have different widths in the second direction DR2. The parts of the bank layer BNL that extend in the first direction DR1 may overlap with the second bank patterns BP2 in a thickness direction of the first substrate SUB, i.e., the third direction DR3. The bank patterns BP may be arranged in an entire display area DPA as island patterns.

A plurality of electrodes RME may include first electrodes RME1, which are disposed in the middle of the first, second, and third subpixels SPX1, SPX2, and SPX3, and second electrodes RME2, which are each disposed across two different subpixels SPXn in the second direction DR2. The first electrodes RME1 and the second electrodes RME2 may generally extend in the first direction DR1 and may have different shapes in the emission areas EMA of the first, second, and third subpixels SPX1, SPX2, and SPX3.

The first electrodes RME1 may be disposed in the middle of the first, second, and third subpixels SPX1, SPX2, and SPX3, and parts of the first electrodes RME1 in the emission areas EMA may be disposed on the first bank patterns BP1. The first electrodes RME1, like their counterpart of FIG. 2, may extend in the first direction DR1 from the subareas SA to subareas SA of other neighboring subpixels SPXn in the first direction DR1. The first electrodes RME1 may have different widths from part to part in the second direction DR2, and parts of the first electrodes RME1 on the first bank patterns BP1 may have a greater width than the first bank patterns BP1 in the second direction DR2, at least in the emission areas EMA. The first electrodes RME1 may be disposed to cover both side surfaces of each of the first bank patterns BP1.

The second electrodes RME2 may include parts that extend in the first direction DR1 and parts that branch off near the emission areas EMA. In one or more embodiments, the second electrodes RME2 may include electrode stems RM_S, which extend in the first direction DR1, and electrode branches (RM_B1 and RM_B2), which branch off of the electrode stems RM_S to be bent in the second direction DR2 and extend back in the first direction DR1. The electrode stems RM_S may be disposed on first sides, in the second direction DR2, of the subareas SA of the first, second, and third subpixels SPX1, SPX2, and SPX3 to overlap with the parts of the bank layer BNL that extend in the first direction DR1. The electrode branches (RM_B1 and RM_B2) may branch off of the electrode stems RM_S, which are disposed on the parts of the bank layer BNL that extend in the first direction DR1 and on the parts of the bank layer BNL that extend in the second direction DR2, and may be bent from both sides, in the second direction DR2, of their respective electrode stems RM_S. The electrode branches (RM_B1 and RM_B2) may be arranged along the first direction DR1 over two different emission areas EMA and may then be bent to be incorporated into, and connected to, the electrode stems RM_S. That is, the electrode branches (RM_B1 and RM_B2) may branch off of the electrode stems RM_S, above the emission areas EMA, and may be connected together, below the emission areas EMA.

The second electrodes RME2 may include first electrode branches RM_B1, which are disposed on the left sides of the first electrodes RME1, and second electrode branches RM_B2, which are disposed on the right sides of the first electrodes RME1. First and second electrode branches RM_B1 and RM_B2 of one second electrode RME2 may be disposed in the emission areas EMA of two adjacent subpixels SPXn in the second direction DR2, and first and second electrode branches RM_B1 and RM_B2 of two different adjacent second electrodes RME2 may be disposed in the same subpixel SPXn. The first electrode branch RM_B1 of one second electrode RME2 may be disposed on the left side of a first electrode RME1, and the second electrode branch RM_B2 of another electrode RME2 may be disposed on the right side of the first electrode RME1.

The electrode branches (RM_B1 and RM_B2) of the second electrodes RME2 may be disposed on sides of the second bank patterns BP2. The first electrode branches RM_B1 may be disposed on the second bank patterns BP2 on the left sides of the first bank patterns BP1, and the second electrode branches RM_B2 may be disposed on the second bank patterns BP2 on the right sides of the first bank patterns BP1. Each of the first electrodes RME1 may be spaced from, and face, two different electrode branches (RM_B1 and RM_B2) of two different electrodes RME2, and the distance between the first electrodes RME1 and the electrode branches (RM_B1 and RM_B2) of the second electrodes RME2 may be smaller than the distance between the bank patterns BP.

Also, the width, in the first direction DR2, of the first electrodes RME1 may be greater than the width of the electrode stems RM_S and the electrode branches (RM_B1 and RM_B2) of the second electrodes RME2. The first electrodes RME1 may cover both side surfaces of their respective first bank patterns BP1, whereas the second electrodes RME2 may be formed to have a relatively small width and may thus cover only one side surface of their respective second bank patterns BP2 with the electrode branches (RM_B1 and RM_B2).

The first electrodes RME1 may be in contact with second conductive patterns CDP2 of a third conductive layer through first contact holes CTD, in areas that overlap with the parts of the bank layer BNL that extend in the second direction DR2. In the embodiment of FIGS. 15-18, unlike in the embodiment of FIG. 2, the first contact holes CTD may be disposed below the bank layer BNL, but not in the subareas SA. The electrode stems RM_S of the second electrodes RME2 may be in contact with second voltage lines VL2 of the third conductive layer through second contact holes CTS. First contacts CT1 of a first insulating layer PAS1 may be disposed in parts of the first electrodes RME1 that are disposed in the subareas SA, and may be in contact with first connecting electrodes CNE1. The second electrodes RME2 may include parts that protrude in the second direction DR2 from the electrode stems RM_S to be disposed in the subareas SA, and second contacts CT2 of the first insulating layer PAS1 may be disposed in the parts of the second electrodes RME2 that protrude and may be in contact with the second connecting electrodes CNE2.

The location of the first contact holes CTD may vary from one subpixel SPXn to another subpixel SPXn of the pixel PX. A first contact hole CTD of the first subpixel SPX1 may be disposed above the emission area EMA of the first subpixel SPX1, and first contact holes CTD of the second and third subpixels SPX2 and SPX3 may be disposed below the emission areas EMA of the second and third subpixels SPX2 and SPX3. The location of the first contact holes CTD may vary depending on the planar layout of the third conductive layer.

The first electrodes RME1 may be disposed in the subareas SA to be separated by separation parts ROP, whereas the second electrodes RME2 may not be separated in the subareas SA. Each of the second electrodes RME2 may include a plurality of electrode stems RM_S and electrode branches (RM_B1 and RM_B2) and may extend in the first direction DR1, and the second electrodes RME2 may branch off near the emission areas EMA of the first, second, and third subpixels SPX1, SPX2, and SPX3. The first electrodes RME1 may be disposed between the separation parts ROP of the subareas SA and may extend across the emission areas EMA of the adjacent subpixels SPXn in the first direction DR1.

The display device 10_1 may further include dummy patterns DP, which are disposed in the subareas SA, between first electrodes RME1 of different subpixels SPXn. The dummy patterns DP may be spaced from the first electrodes RME1 with the separation parts ROP interposed therebetween. Two separation parts ROP, i.e., upper and lower separation parts ROP, may be disposed in the subarea SA of one subpixel SPXn. In this case, a dummy pattern DP may be disposed to be spaced from a first electrode RME1 of the subpixel SPXn with the lower separation part ROP interposed therebetween and from a first electrode RME1 of another subpixel SPXn in the first direction DR1 with the upper separation part ROP interposed therebetween. The dummy patterns DP, like the first, third, and fourth electrodes RME1, RME3, and RME4 of each subpixel SPXn of FIG. 2, may be formed to be connected to the first electrodes RME1 by electrode connectors CEP. As the first insulating layer PAS1 and a second insulating layer PAS2 are not disposed in the separation parts ROP, the removal of the electrode connectors CEP may be performed so that the first electrodes RME1 may be disconnected and separated from the dummy patterns DP.

The dummy patterns DP may be connected to first voltage lines VL1 of the third conductive layer through third contact holes CTA, which penetrate a via layer VIA and a first passivation layer PV1. The first electrodes RME1 may be formed to be connected to the dummy patterns DP, and electrical signals for arranging light-emitting elements ED may be applied from the first voltage lines VL1 to the first electrodes RME1. The arrangement of the light-emitting elements ED may be performed by applying signals to the first voltage lines VL1 and the second voltage lines VL2, and the signals may then be transmitted to the first electrodes RME1 and the second electrodes RME2.

The light-emitting elements ED may be disposed on different electrodes RME, between different bank patterns BP. The light-emitting elements ED may include first light-emitting elements ED1, which are disposed between the first and second bank patterns BP1 and BP2, and have respective end portions disposed on the first electrodes RME1 and the second electrode branches RM_B2 of the second electrodes RME2, and second light-emitting elements ED2, which have respective end portions disposed on the first electrodes RME1 and the first electrode branches RM_B1 of the second electrodes RME2. The first light-emitting elements ED1 may be disposed on the right sides of the first electrodes RME1, and the second light-emitting elements ED2 may be disposed on the left sides of the first electrodes RME1.

The connecting electrodes CNE may include first connecting electrodes CNE1 and second connecting electrodes CNE2, which are first-type connecting electrodes, and third connecting electrodes CNE3, which are second-type connecting electrodes.

The first connecting electrodes CNE1 may extend in the first direction DR1 and may be disposed on the first electrodes RME1. Parts of the first connecting electrodes CNE1 on the first bank patterns BP1 may overlap with the first electrodes RME1 and may extend therefrom in the first direction DR1 to be disposed even in the subareas SA above the emission areas EMA, beyond the bank layer BNL. The first connecting electrode CNE1 may be in contact with the first electrodes RME1 through the first contacts CT1, in the subareas SA.

The second connecting electrodes CNE2 may extend in the first direction DR1 and may be disposed on the second electrodes RME2. Parts of the second connecting electrodes CNE2 on the second bank patterns BP2 may overlap with the second electrodes RME2 and may extend therefrom in the first direction DR1 to be disposed even in the subareas SA above the emission areas EMA, beyond the bank layer BNL. The second connecting electrodes CNE2 may be in contact with the second electrodes RME2 through the second contacts CT2, in the subareas SA.

The third connecting electrodes CNE3 may include extensions (CN_E1 and CN_E2), which extend in the first direction DR1, and first connectors CN_B1, which connect the extensions (CN_E1 and CN_E2). First extensions CN_E1 may oppose (or face) the first connecting electrodes CNE1, in the emission areas EMA, and may be disposed on the second electrode branches RM_B2 of the second electrodes RME2, and second extensions CN_E2 may oppose (or face) the second connecting electrodes CNE2, in the emission areas EMA, and may be disposed on the first electrodes RME1. The first connectors CN_B1 may extend in the second direction DR2, on parts of the bank layer BNL below the emission areas EMA. Third connecting electrodes CNE3 may be disposed in the emission areas EMA and on the bank layer BNL and may not be directly connected to the electrodes RME. The second electrode branches RM_B2, which are disposed below the first extensions CN_E1, may be electrically connected to the second voltage lines VL2, and a second power supply voltage applied to the second electrode branches RM_B2 may not be transmitted to the third connecting electrodes CNE3. The first connecting electrodes CNE1 and the second connecting electrodes CNE2 may be first-type connecting electrodes that are directly connected to the electrodes RME, and the third connecting electrodes CNE3 may be second-type connecting electrodes that are not directly connected to the electrodes RME.

In the embodiments of FIGS. 15-18, separation parts ROP where the separation of the electrodes RME is performed are disposed in each of the subareas SA, and the third contact holes CTA, which penetrate the via layer VIA, are disposed in the subareas SA. The first insulating layer PAS1 may not be disposed in the separation parts ROP of each of the subareas SA and may include openings OP, which overlap with the third contact holes CTA, and the second insulating layer PAS2 may not be disposed in the separation parts ROP of each of the subareas SA, but may be disposed to cover the openings OP.

Figure 19:
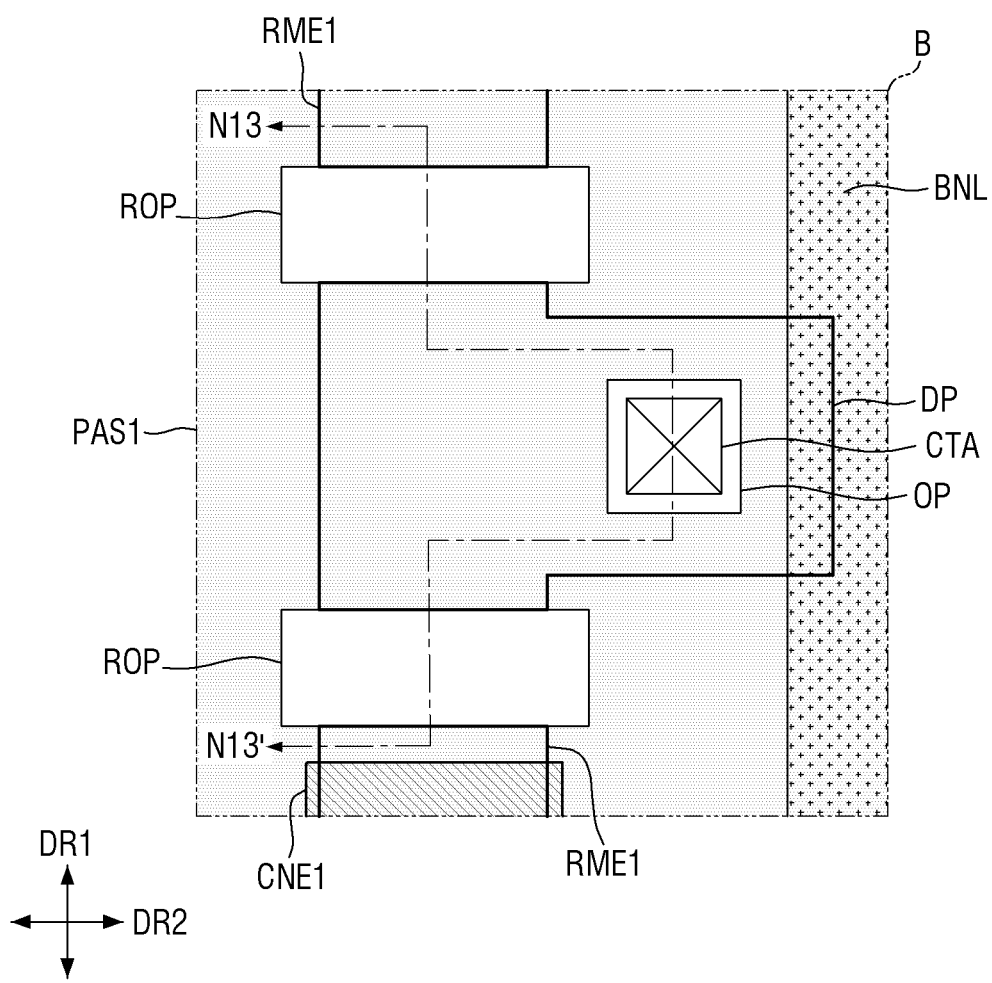
FIG. 19 is an enlarged plan view of part B of FIG. 16.
Figure 20:
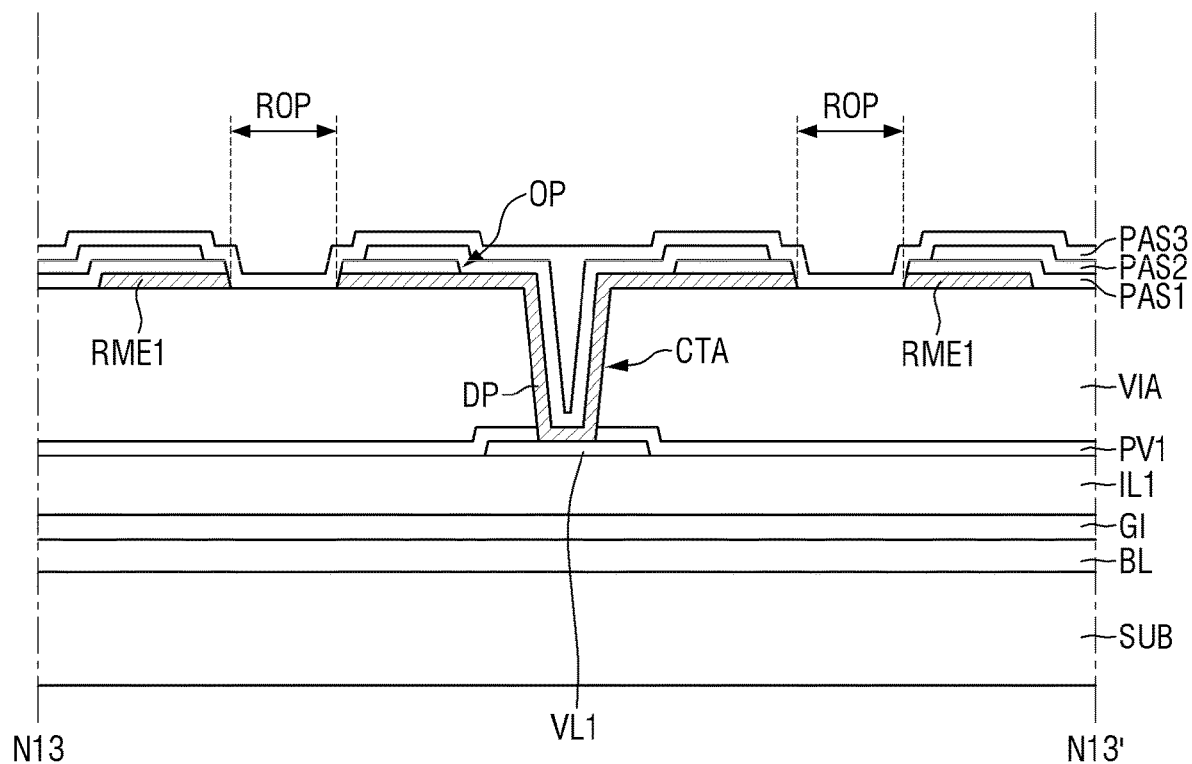
FIG. 20 is a cross-sectional view taken along the line N13-N13' of FIG. 19.

FIG. 19 is an enlarged plan view of part B of FIG. 16. FIG. 20 is a cross-sectional view taken along the line N13-N13' of FIG. 19. FIG. 19 illustrates a plan view illustrating part of the subarea SA of the first subpixel SPX1 of FIG. 16 where a dummy pattern DP and separation parts ROP are disposed, and FIG. 20 illustrates a cross-sectional view taken across a plurality of separation parts ROP and an opening OP of FIG. 19.

Referring to FIGS. 19 and 20 and further to FIG. 16, a dummy pattern DP, which is spaced from first electrodes RME1, may be disposed in the subarea SA, and a plurality of first, second, and third insulating layers PAS1, PAS2, and PAS3 may be disposed on the dummy pattern DP. In the subarea SA, a plurality of separation parts ROP may be formed with the dummy pattern DP interposed therebetween, and first electrodes RME1 of different subpixels SPXn may be disposed to adjoin (e.g., contact) different separation parts ROP. For example, the first electrode RME1 of the first subpixel SPX1 is disposed to adjoin (e.g., contact) the lower separation part ROP below the dummy pattern DP, and a first electrode RME1 of a subpixel SPXn adjacent to the first subpixel SPX1 in the first direction DR1 is disposed to adjoin (e.g., contact) the upper separation part ROP above the dummy pattern DP. In one or more embodiments, the electrode stems RM_S of the second electrodes RME2 may be disposed to overlap with the bank layer BNL and may be spaced from the separation parts ROP of the subarea SA and the dummy pattern DP.

The dummy pattern DP and the first electrodes RME1 may initially be formed to be connected and may be separated later in the separation parts ROP of the subarea SA. The dummy pattern DP and the first electrodes RME1 may be separated by removing electrode connectors CEP, which connect some of the electrodes RME. In the separation parts ROP of the subarea SA, the first and second insulating layers PAS1 and PAS2 may not be disposed, and the third insulating layer PAS3 may cover the separation parts ROP. The third insulating layer PAS3 may be in direct contact with the top surface of the via layer VIA and, in part, with the first electrodes RME1 and the dummy pattern DP, in the separation parts ROP.

The first insulating layer PAS1 may not be disposed in the separation parts ROP of the subarea SA and may include an opening OP, which exposes part of the dummy pattern DP. The opening OP may be disposed to overlap with a third contact hole CTA, and the diameter of the opening OP may be greater than the diameter of the third contact hole CTA. The area of the separation parts ROP where the first insulating layer PAS1 is not disposed may be greater than the area of the opening OP.

In one or more embodiments, the second insulating layer PAS2 may cover the entire subarea SA except for the separation parts ROP. The second insulating layer PAS2 may cover the opening OP and may be in direct contact with the dummy pattern DP. The removal of the electrode connectors CEP may be performed with the first and second insulating layers PAS1 and PAS2 not disposed in the separation parts ROP, and the rest of the subarea SA may be protected by the second insulating layer PAS2.

Figure 21:
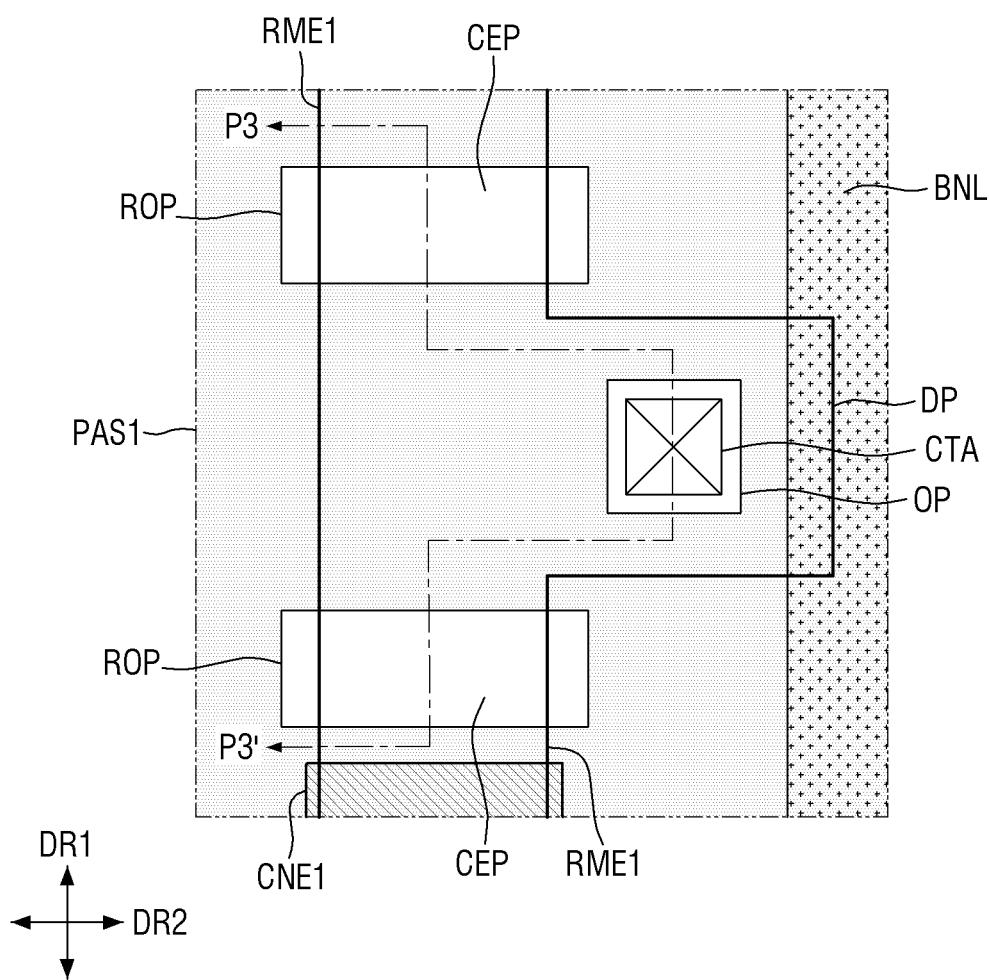
FIGS. 21 and 22 are a plan view and a cross-sectional view, respectively, illustrating the shapes of electrodes in a subarea during a fabrication of the display device of FIG. 15.
Figure 22:
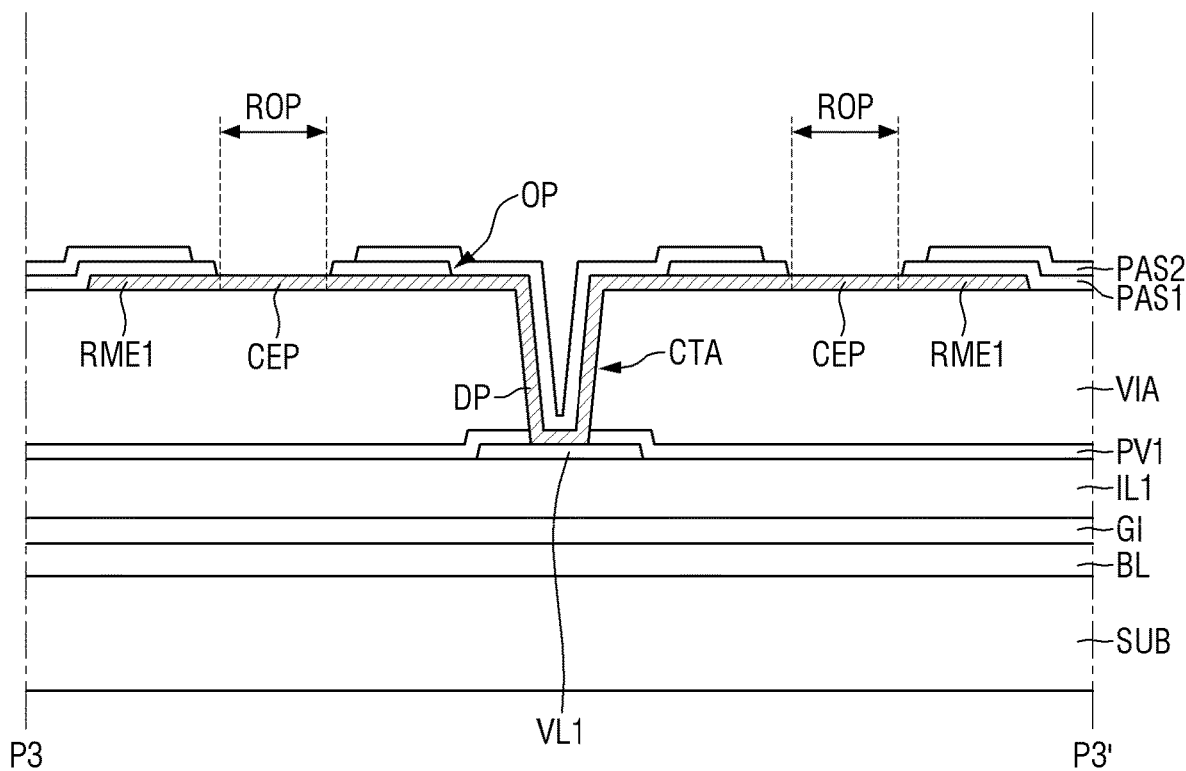

FIGS. 21 and 22 are a plan view and a cross-sectional view, respectively, illustrating the shapes of electrodes in a subarea during the fabrication of the display device of FIG. 15. FIG. 21 illustrates a plan view illustrating how a dummy pattern DP and first electrodes RME1 are connected by electrode connectors CEP in a subarea SA, and FIG. 22 illustrates a cross-sectional view taken along the line P3-P3' of FIG. 21, across separation parts ROP and an opening OP of FIG. 21.

Referring to FIGS. 21 and 22, the first electrodes RME1 and the dummy pattern DP may be formed to be connected by the electrode connectors CEP. The dummy pattern DP may be connected to the first electrodes RME1, which are disposed above and below the dummy pattern DP, by the electrode connectors CEP. As the electrode connectors CEP are removed later, the separation parts ROP of the subarea SA may be set as areas where the electrode connectors CEP are disposed.

The first insulating layer PAS1 may be disposed to cover electrodes RME, but expose the electrode connectors CEP and part of the dummy pattern DP. The areas where the electrode connectors CEP, which connect the dummy pattern DP and the first electrodes RME, may become the separation parts ROP, and the first insulating layer PAS1 may not be disposed in the separation parts ROP. The first insulating layer PAS1 may include an opening OP, which exposes part of the dummy pattern DP that overlaps with a third contact hole CTA.

Light-emitting elements ED may be arranged in an emission area EMA by applying electrical signals to electrodes RME with the first insulating layer PAS1 formed thereon. The electrical signals may be applied to first and second voltage lines VL1 and VL2, and the electrical signals applied to the first voltage line VL1 may be transmitted to the dummy pattern DP, which is connected to the first voltage line VL1 through the third contact hole CTA. As the dummy pattern DP is connected to the first electrodes RME1 by the electrode connectors CEP, the electrical signals may be transmitted to the first electrodes RME1.

After the arrangement of the light-emitting elements ED, the second insulating layer PAS2 may be disposed to cover the light-emitting elements ED. The second insulating layer PAS2 may cover the emission area EMA and the subarea, but may not be disposed in the separation parts ROP. As the removal of the electrode connectors CEP is performed in the separation parts ROP, the second insulating layer PAS2 may expose the electrode connectors CEP. On the contrary, the second insulating layer PAS2 may cover the opening OP of the first insulating layer PAS1, in the subarea SA, so that the dummy pattern DP may not be entirely exposed.

Thereafter, as the entire subarea SA except for the separation parts ROP is covered by the second insulating layer PAS2, during the removal of the electrode connectors CEP, the electrodes RME can be prevented from being damaged by any residues from patterning. As the second insulating layer PAS2 covers the opening OP, the dummy pattern DP, which overlaps with the third contact hole CTA, can be protected.

In concluding the detailed description, those skilled in the art will appreciate that many variations and modifications can be made to the embodiments of the present disclosure without substantially departing from the principles, scope, or spirit of the present disclosure. Therefore, the disclosed embodiments of the present disclosure are used in a generic and descriptive sense only and not for purposes of limitation.

What is claimed is:

1. A display device comprising:
   an emission area and a subarea located at a side of the emission area in a first direction;
   a first electrode extending in the first direction across the emission area and the subarea;
   a second electrode spaced from the first electrode in a second direction, the second electrode extending in the first direction;
   a first insulating layer on the first and second electrodes, the first insulating layer including an opening in the subarea;
   a plurality of light-emitting elements located on the first and second electrodes in the emission area; and
   a second insulating layer on the first insulating layer in the subarea,
   wherein the first electrode comprises a first electrode extension located in the subarea at a first contact hole,
   wherein the opening overlaps with the first contact hole and is located above the first electrode extension, and
   wherein the second insulating layer overlaps the opening.

2. The display device of claim 1, further comprising a separation part located in the subarea, the separation part having none of the first and second insulating layers disposed therein,
   wherein the first electrode adjoins the separation part of the subarea and the separation part of another subarea.
3. The display device of claim 2, wherein an area of the opening of the first insulating layer is smaller than an area of the separation part.
4. The display device of claim 2, further comprising:
   a third electrode located between the first and second electrodes, the third electrode extending in the first direction from the separation part; and
   a fourth electrode spaced from the third electrode in the second direction with the first electrode interposed therebetween,
   wherein the light-emitting elements comprise first light-emitting elements located on the first and fourth electrodes, and second light-emitting elements located on the second and third electrodes.
5. The display device of claim 4, wherein one end portion, in the first direction, of the third electrode adjoins the separation part, and
   wherein another end portion, in the first direction, of the third electrode is located in the emission area.
6. The display device of claim 4, wherein the fourth electrode adjoins a side, in the second direction, of the separation part of the subarea and extends in the first direction to adjoin a side, in the first direction, of the separation part of another subarea.
7. The display device of claim 2, further comprising:
   a first connecting electrode on the first electrode, in the emission area, the first connecting electrode being in contact with the light-emitting elements; and
   a second connecting electrode on the second electrode, in the emission area, the second connecting electrode being in contact with the light-emitting elements,
   wherein the first insulating layer further includes a plurality of contacts overlapping the first or second electrodes in the emission area,
   wherein the first connecting electrode is in contact with the first electrode through a first contact, and
   wherein the second connecting electrode is in contact with the second electrode through a second contact.
8. The display device of claim 2, further comprising a third insulating layer on the second insulating layer,
   wherein the third insulating layer overlaps the separation part, in the subarea.
9. The display device of claim 1, further comprising a bank layer on the first insulating layer, wherein the bank layer is around the emission area and the subarea,
   wherein the second electrode overlaps with a part of the bank layer that extends in the first direction.
10. The display device of claim 9, wherein the second electrode comprises a second electrode extension at a second contact hole to overlap with the part of the bank layer that extends in the first direction, on a lower side of the emission area.
11. A display device comprising:
    a first substrate including an emission area and a subarea located at a side of the emission area in a first direction;
    a via layer on the first substrate;
    a first electrode extending in the first direction on the via layer across the emission area and the subarea;
    a plurality of second electrodes spaced from each other in a second direction with the first electrode interposed therebetween;
    a dummy pattern located in the subarea to be spaced from the first electrode;
    a first insulating layer on the first and second electrodes and including an opening above the dummy pattern in the subarea;
    a plurality of light-emitting elements located on the first and second electrodes, in the emission area; and
    a second insulating layer on the light-emitting elements in the emission area, and on the first insulating layer in the subarea,
    wherein the second insulating layer overlaps the opening and is in direct contact with the dummy pattern.
12. The display device of claim 11, further comprising a separation part located in the subarea, the separation part having none of the first and second insulating layers disposed therein,
    wherein the first electrode is spaced from the dummy pattern with the separation part interposed therebetween.
13. The display device of claim 12, further comprising a bank layer on the first insulating layer,
    wherein the bank layer is around the emission area and the subarea,
    wherein the first electrode overlaps with a part of the bank layer that extends in the second direction and is at a first contact hole that penetrates the via layer, and
    wherein one of the second electrodes overlaps with a part of the bank layer that extends in the first direction and is at a second contact hole that penetrates the via layer.
14. The display device of claim 13, wherein the dummy pattern is in the subarea at a third contact hole that penetrates the via layer, and
    wherein the opening overlaps with the third contact hole.
15. The display device of claim 14, further comprising:
    a conductive layer located between the first substrate and the via layer, the conductive layer including a first voltage line, a second voltage line, and a conductive pattern,
    wherein the first electrode is in contact with the conductive pattern through the first contact hole,
    wherein the second electrode is in contact with the second voltage line through the second contact hole, and
    wherein the dummy pattern is in contact with the first voltage line through the third contact hole.
16. The display device of claim 13, wherein the second electrode overlaps the bank layer, on a side, in the second direction, of the subarea and is spaced from the separation part.
17. The display device of claim 11, wherein one of the second electrodes comprises electrode stems extending in the first direction and located at respective sides of the subarea that are spaced from each other in the second direction, and a plurality of electrode branches that branch from the electrode stems to be located in different emission areas, and
    wherein the first electrode is spaced from and oppose electrode branches of different second electrodes in the emission area.
18. The display device of claim 17, wherein the electrode branches comprise a first electrode branch at a side, in the second direction, of the first electrode, and a second electrode branch at another side, in the second direction, of the first electrode, and
    wherein the light-emitting elements include first light-emitting elements on the first electrode and the second electrode branch, and second light-emitting elements on the first electrode and the first electrode branch.

19. The display device of claim 18, further comprising:
a first connecting electrode on the first electrode and in contact with the first light-emitting elements;
a second connecting electrode on the second electrode and in contact with the second light-emitting elements; and
a third connecting electrode comprising a first extension, a second extension, and a first connector, the first extension being on the second electrode branch and being in contact with the first light-emitting elements, the second extension being on the first electrode branch and being in contact with the second light-emitting elements, and the first connector connecting the first and second extensions.

20. The display device of claim 19, wherein the first insulating layer further includes a plurality of contacts overlapping the first electrode or the second electrodes, in the emission area,
wherein the first connecting electrode is in contact with the first electrode through a first contact, and
wherein the second connecting electrode is in contact with one of the second electrodes through a second contact.

* * * * *